US011031717B2

(12) United States Patent
Cho et al.

(10) Patent No.: US 11,031,717 B2
(45) Date of Patent: Jun. 8, 2021

(54) DUAL CONTACT MEMBER AND ELECTRONIC DEVICE THEREWITH

(71) Applicants: Samsung Electronics Co., Ltd., Gyeonggi-do (KR); Hyupjinconnector Co., Ltd., Gyeonggi-do (KR)

(72) Inventors: Yonglak Cho, Gyeonggi-do (KR); Jeongki Park, Gyeonggi-do (KR); Mihyun Kim, Gyeonggi-do (KR); Jeongyong Lee, Gyeonggi-do (KR); Choonggeun Lee, Gyeonggi-do (KR); Dongjin Chung, Gyeonggi-do (KR); Jangwon Hur, Gyeonggi-do (KR); Jiwoo Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 41 days.

(21) Appl. No.: 16/511,331

(22) Filed: Jul. 15, 2019

(65) Prior Publication Data

US 2020/0052428 A1    Feb. 13, 2020

(30) Foreign Application Priority Data

Aug. 13, 2018  (KR) .......................... 10-2018-0094581

(51) Int. Cl.
  *H01R 13/24*   (2006.01)
  *H05K 1/18*    (2006.01)
  (Continued)

(52) U.S. Cl.
  CPC ......... *H01R 13/2435* (2013.01); *H01Q 1/243* (2013.01); *H01Q 5/307* (2015.01); *H05K 1/182* (2013.01); *H05K 2201/10295* (2013.01)

(58) Field of Classification Search
  CPC ........................... H01R 13/2435; H01Q 5/307
  (Continued)

(56) References Cited

U.S. PATENT DOCUMENTS 3,474,380 A * 10/1969 Miller .................. H01R 12/721
                                                 439/752
4,872,091 A * 10/1989 Maniwa ..................... B41J 5/48
                                                 361/679.31
(Continued)

FOREIGN PATENT DOCUMENTS

KR   10-2012-0023952 A   3/2012
KR   10-2015-0096986 A   8/2015
(Continued)

OTHER PUBLICATIONS

International Search Report dated Oct. 29, 2019.

*Primary Examiner* — Neil Abrams
(74) *Attorney, Agent, or Firm* — Cha & Reiter, LLC.

(57) ABSTRACT

The disclosure includes a housing including a first plate, a second plate, and a side member surrounding a space between the first and second plates, a printed circuit board disposed in the space and including an opening, a first conductive structure disposed in the space, a second conductive structure disposed in the space, and a flexible conductive member located between the first and second conductive structures through the opening to construct an electrical path between the first and second conductive structures. The flexible conductive member may include a base, a first flexible portion having a first height from the base, protruding from the base toward the first plate, and in contact with the first conductive structure, and a second flexible portion having a second height from the base, protruding from the base toward the second plate, and in contact with the second conductive structure.

18 Claims, 37 Drawing Sheets

(51) Int. Cl.
*H01Q 1/24* (2006.01)
*H01Q 5/307* (2015.01)

(58) Field of Classification Search
USPC .................................. 439/862, 92, 95, 76.1
See application file for complete search history.

(56) References Cited

U.S. PATENT DOCUMENTS

| | | | | |
|---|---|---|---|---|
| 5,005,106 A * | 4/1991 | Kiku | ............... | H05K 5/0269 174/350 |
| 5,115,220 A * | 5/1992 | Suuronen | ............. | H01H 85/157 337/152 |
| 5,210,442 A * | 5/1993 | Ishimoto | ............. | G06K 19/077 235/490 |
| 5,453,028 A * | 9/1995 | Grambley | ............. | H01R 4/4827 439/441 |
| 5,510,959 A * | 4/1996 | Derstine | ............. | H05K 5/0269 174/358 |
| 5,513,996 A * | 5/1996 | Annerino | ............. | H01R 4/4809 439/95 |
| 5,537,294 A * | 7/1996 | Siwinski | ............. | H05K 5/0269 361/753 |
| 5,564,933 A * | 10/1996 | Bouchan | ............. | G06K 7/0047 439/76.1 |
| 5,600,092 A * | 2/1997 | Patscheck | ................ | H01R 4/64 174/351 |
| 5,603,620 A * | 2/1997 | Hinze | ............... | H01R 13/6581 439/95 |
| 5,833,473 A * | 11/1998 | Betker | ................ | G06K 19/077 439/76.1 |
| 5,890,917 A * | 4/1999 | Ishida | .................. | H01R 12/725 439/101 |
| 5,896,274 A * | 4/1999 | Ishida | .................. | H05K 5/0269 361/737 |
| 5,980,268 A * | 11/1999 | Mischenko | ........ | H01R 13/2435 439/66 |
| 6,071,130 A * | 6/2000 | Johnson | ............. | H01R 13/6485 439/76.1 |
| 6,089,882 A * | 7/2000 | Costello | ............. | H01R 13/6583 439/95 |
| 6,276,965 B1* | 8/2001 | Madsen | ............. | H01R 13/6582 439/607.01 |
| 6,456,504 B1* | 9/2002 | LoForte | ............... | H05K 5/0269 361/737 |
| 6,984,130 B2* | 1/2006 | Richter | ............... | H01R 13/2435 439/66 |
| 7,130,195 B2* | 10/2006 | Kawano | ............ | H05K 7/20518 361/719 |
| 7,170,006 B1* | 1/2007 | Burrell | ................ | H01M 50/209 174/94 R |
| 7,598,924 B2* | 10/2009 | Hynes | .................... | H01Q 1/243 343/702 |
| 7,738,260 B2* | 6/2010 | Stanley | ............... | H04M 1/0235 361/799 |
| 7,744,384 B2* | 6/2010 | Wu | ....................... | H05K 1/0215 439/95 |
| 8,068,067 B2* | 11/2011 | Hong | .................... | H01Q 1/1207 343/873 |
| 8,238,071 B2* | 8/2012 | Weng | .................... | H05K 9/0067 361/220 |
| 8,406,008 B2* | 3/2013 | Han | ...................... | H04M 1/026 361/799 |
| 8,517,777 B2* | 8/2013 | Haans | ................. | H01R 13/02 439/816 |
| 8,864,524 B2* | 10/2014 | Sato | ..................... | H01R 13/245 439/630 |
| 9,013,356 B2* | 4/2015 | Wang | .................. | H01Q 1/242 343/702 |
| 9,017,115 B2* | 4/2015 | Connell | ............. | H01R 12/7082 439/862 |
| 9,065,175 B2* | 6/2015 | Corbin | ................ | H05K 1/0215 |
| 9,178,310 B2* | 11/2015 | Tsai | ...................... | H01R 31/06 |
| 9,320,132 B2* | 4/2016 | Lee | ....................... | H05K 1/0215 |
| 9,379,491 B2* | 6/2016 | Lee | ...................... | H01R 13/2407 |
| 9,768,537 B2* | 9/2017 | Kim | ....................... | H01R 12/714 |
| 9,853,377 B2* | 12/2017 | Kim | ........................ | H05K 1/02 |
| 9,964,326 B2* | 5/2018 | Khoury | ................ | H02H 9/04 |
| 10,411,327 B2* | 9/2019 | Kim | ..................... | H01Q 1/243 |
| 10,498,057 B2* | 12/2019 | Ryu | ..................... | H01R 12/7064 |
| 2014/0302730 A1* | 10/2014 | Yang | ..................... | H01R 12/55 439/884 |
| 2016/0254588 A1 | 9/2016 | Kim et al. | | |
| 2016/0294086 A1 | 10/2016 | Kim et al. | | |
| 2016/0360015 A1 | 12/2016 | Lee et al. | | |
| 2017/0288332 A1 | 10/2017 | Kato et al. | | |
| 2020/0052428 A1* | 2/2020 | Cho | .................... | H01R 12/718 |

FOREIGN PATENT DOCUMENTS

KR  10-2015-0097360 A  8/2015
KR     10-1850387 B1   5/2018

\* cited by examiner

DUAL CONTACT MEMBER AND ELECTRONIC DEVICE THEREWITH

CROSS REFERENCE TO RELATED APPLICATION(S)

This application is based on and claims priority under 35 U.S.C. 119 to Korean Patent Application No. 10-2018-0094581, filed on Aug. 13, 2018, in the Korean Intellectual Property Office, the disclosures of which are herein incorporated by reference in their entireties.

BACKGROUND

Field

Certain embodiments of the disclosure generally relate to a dual contact structure for electrically connecting different components in an electronic device.

Description of Related Art

When an antenna contact structure is disposed within an electronic device, the contact structure can be configured by using a plurality of single contact terminals to electrically connect different components, such as an antenna and a Radio Frequency (RF) circuitry.

For example, two single contact terminals may include a first contact terminal which connects a first antenna and a printed circuit board and a second contact terminal which connects a second antenna and the printed circuit board.

Inside the electronic device, isolation between the first antenna and a neighboring conductor (e.g., a display panel) may be an important factor in terms of antenna performance.

However, the contact structure between different components, e.g., antennas, of the conventional electronic device may have a problem in that a vertical gap between components cannot be ensured due to the height of the single contact terminal and the thickness of the antenna, which may be constructed as part of the metal housing of the electronic device. Accordingly, isolation between components may not be guaranteed.

SUMMARY

An electronic device according to one embodiment of the disclosure may include a housing including a first plate, a second plate facing away from the first plate, and a side member surrounding a space between the first and second plates, a printed circuit board disposed in the space, parallel to the first plate, and including an opening, a first conductive structure disposed in the space and at least partially located between the printed circuit board and the first plate, a second conductive structure disposed in the space and at least partially located between the printed circuit board and the second plate, and a flexible conductive member located between the first and second conductive structures through the opening to construct an electrical path between the first and second conductive structures. The flexible conductive member may include a base fixed to the printed circuit board, a first flexible portion having a first height from the base, protruding from the base toward the first plate, and in contact with the first conductive structure, and a second flexible portion having a second height from the base, protruding from the base toward the second plate, and in contact with the second conductive structure.

A dual contact member according to one embodiment of the disclosure may include a base, a first flexible portion bent from one side of the base to be disposed in a first direction, a second flexible portion bent from another side of the base to be disposed in a second direction opposite to the first direction, and an suction region disposed in a portion of the first flexible portion or second flexible portion parallel to the base so as to be mounted to a printed circuit board.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
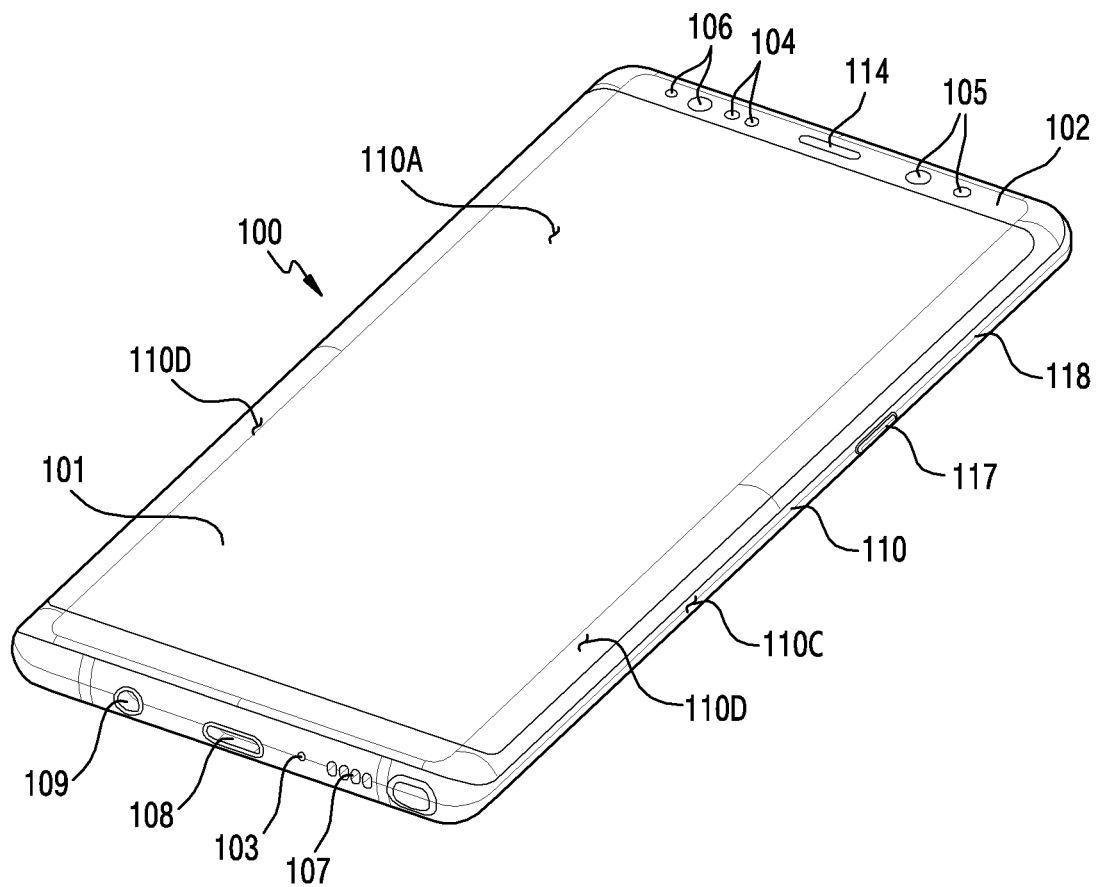
FIG. 1 is a perspective view illustrating a front face of an electronic device according to an embodiment.

Hereinafter, certain embodiments of the present invention will be described with reference to accompanying drawings. However, certain embodiments of the present invention are not limited to specific embodiments, and it should be understood that modification, equivalent, and/or alternative on the certain embodiments described herein can be variously made. With regard to description of drawings, similar components may be marked by similar reference numerals.

An electronic device according to certain embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to certain embodiments may be one or more combinations of the above-mentioned devices. According to a certain embodiment, an electronic device may be a flexible electronic device. Also, electronic devices according to certain embodiments of the present disclosure are not limited to the above-mentioned devices, and may include new electronic devices according to technology development.

Figure 2:
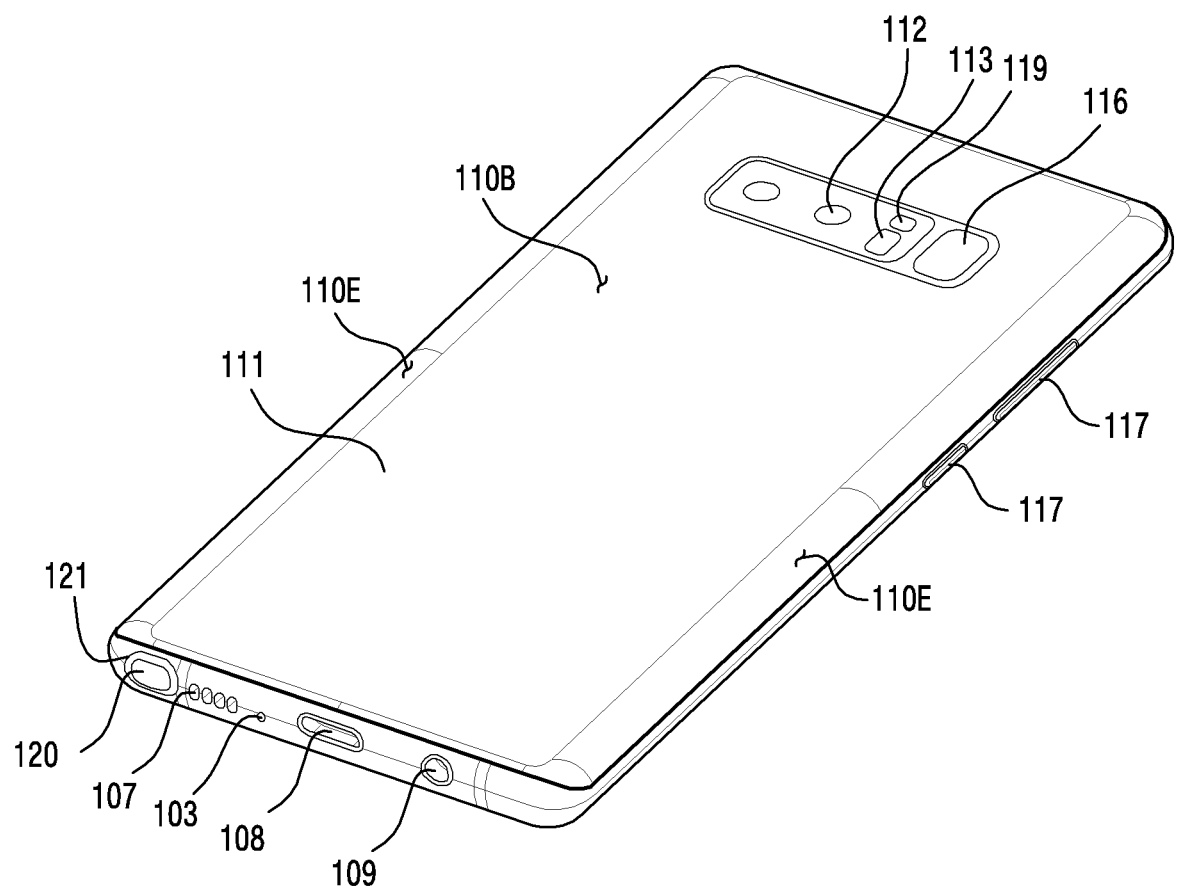
FIG. 2 is a perspective view illustrating a rear face of the electronic device of FIG. 1.

FIG. 1 is a perspective view illustrating a front face of an electronic device according to an embodiment. FIG. 2 is a perspective view illustrating a rear face of the electronic device of FIG. 1.

Referring to FIG. 1 and FIG. 2, an electronic device 100 according to an embodiment may include a housing 110 including a first face (or a front face) 110A, a second face (or a rear face) 110B, and a third face (or side face) 110C surrounding a space between the first face 110A and the second face 110B. In another embodiment (not shown), the housing may refer to a structure which constitutes part of the first face 110A, second face 110B, and third face 110C of FIG. 1. According to an embodiment, the first face 110A may include a front plate 102 (e.g., a polymer plate or a glass plate having various coating layers) which is at least partially transparent. The second face 110B may include a rear plate 111 which may be substantially opaque. For example, the rear plate 111 may be made of coated or colored glass, ceramic, polymer, metallic materials (e.g. aluminum, stainless steel (STS), or magnesium) or a combination of at least two of the these materials. The side face 110C may include a side bezel structure (or a side member) 118 bonded to the front plate 102 and the rear plate 111 and may be made of metal and/or polymer. In some embodiments, the rear plate 111 and the side bezel structure 118 may be constructed integrally and may be made with the same material (e.g., metallic material such as aluminum).

In the illustrated embodiment, the front plate 102 may include two first regions 110D seamlessly extended by being bent from the first face 110A toward the rear plate 111 at both longitudinal edges (i.e. left and right sides) of the front plate 102. In the illustrated embodiment (see FIG. 2), the rear plate 111 may include two second regions 110E seamlessly extended by being bent from the second face 110B toward the front plate 102 at both longitudinal edges. In some embodiments, the front plate 102 (or the rear plate 111) may include only one of the first regions 110D (or the second regions 110E). In another embodiment, some of the first regions 110D or the second regions 110E may not be included. In that embodiment, in a side view of the electronic device 100, the side bezel structure 118 may have a first thickness (or width) at a portion in which the first regions 110D or the second regions 110E are not included, and may have a second thickness thinner than the first thickness at a portion in which the first regions 110D or the second regions 110E are included.

According to an embodiment, the electronic device 100 may include at least one of a display 101, audio modules 103, 107, and 114, sensor modules 104, 116, and 119, camera modules 105, 112, and 113, a key input device 117, a light emitting element 106, a pen input device 120, and connector holes 108 and 109. In some embodiments, the electronic device 100 may omit at least one of these components (e.g., the key input device 117 or the light emitting element 106), or other components may be additionally included.

The display 101 may be exposed through, for example, some portions of the front plate 102. In some embodiments, at least part of the display 101 may be exposed through the first face 110A and the front plate 102 including the first regions 110D of the side face 110C. In some embodiments, a corner of the display 101 may be shaped to be substantially identical to the shape of an adjacent outer perimeter of the front plate 102. In another embodiment (not shown), spacing between the outer perimeter of the display 101 and the outer perimeter of the front plate 102 may be minimized in order to enlarge the area through which the display 101 is exposed.

In another embodiment (not shown), a recess or opening may be constructed in part of the screen display region of the display 101, and at least one of the audio module 114, the sensor module 104, and the camera module 105, and the light emitting element 106 may be disposed within the recess or the opening. In another embodiment (not shown), at least one of the audio module 114, the sensor module 104, the camera module 105, the fingerprint sensor 116, and the light emitting element 106 may be included in the rear face of the screen display region of the display 101, i.e. these components may be disposed behind the display 101. In another embodiment, the display 101 may be disposed adjacent to or bonded to a touch sensing circuit, a pressure sensor capable of measuring touch strength (pressure), and/ or a digitizer for detecting a magnetic-type stylus pen. In some embodiments, at least part of the sensor modules 104 and 119 and/or at least part of the key input device 117 may be disposed in the first regions 110D and/or the second regions 110E.

The audio modules 103, 107, and 114 may include the microphone hole 103 or the speaker holes 107 and 114. A microphone for acquiring sounds from the external environment of the electronic device 100 may be disposed inside the microphone hole 103. In some embodiments, a plurality of microphones may be disposed so that they can detect directionality of the sound. The speaker holes 107 and 114 may include the external speaker hole 107 and the receiver hole 114, which can be used for phone calls. In some embodiments, the speaker holes 107 and 114 and the microphone hole 103 may be implemented as a single hole, or a speaker (e.g., a Piezo speaker) may be included without the speaker holes 107 and 114.

The sensor modules 104, 116, and 119 may generate an electrical signal or data value corresponding to an internal operational state of the electronic device 100 or an external environmental state. The sensor modules 104, 116, and 119 may include, for example, the first sensor module 104 (e.g., a proximity sensor), second sensor module (not shown) (e.g., a fingerprint sensor) disposed on the first face 110A of the housing 110, the third sensor module 119 (e.g., a Heart Rate Monitoring (HRM) sensor) disposed on the second face 110B of the housing 110, and/or the fourth sensor module 116 disposed on the second face 110B of the housing 110 (e.g., a fingerprint sensor). The fingerprint sensor may be disposed not only to the first face 110A but also the second face 110B of the housing 110. The electronic device 100 may further include other sensor modules (not shown), such as a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and/or an illuminance sensor.

The camera modules 105, 112, and 113 may include the first camera module 105 disposed on the first face 110A of the electronic device 100, the second camera module 112 disposed on the second face 110B, and/or the flash 113. The camera module 105 and 112 may include one or more lenses, image sensors, and/or image signal processors. The flash 113 may include, for example, a Light Emitting Diode (LED) or a xenon lamp. In some embodiments, two or more lenses (infrared cameras, wide angle and telephoto lenses) and image sensors may be disposed on one face of the electronic device 100.

The key input device 117 may be disposed on the side face 110C of the housing 110. In another embodiment, the electronic device 100 may not include the key input device 117. When the hardware key input device 117 is not included, its functionality may be implemented on the display 101 as a soft key or the like. In some embodiments, the key input device may include the sensor module 116 (e.g. a fingerprint sensor) that is disposed on the second face 110B of the housing 110 in the shown embodiment.

The light emitting element 106 may be disposed on, for example, the first face 110A of the housing 110. The light emitting element 106 may provide, for example, status information of the electronic device 100 as optical information (e.g. a flashing signal). In another embodiment, the light emitting element 106 may provide, for example, a light source that operates in connection with the camera module 105. The light emitting element 106 may include, for example, a Light Emitting Diode (LED), an IR LED, and a xenon lamp.

The connector holes 108 and 109 may include the first connector hole 108 capable of accommodating a connector (e.g., a USB connector) for transmitting/receiving power and/or data to and from an external electronic device (e.g. a charger) and the second connector hole 109 (e.g., earphone jack) capable of accommodating a connector for transmitting/receiving an audio signal to and from another external electronic device (e.g. headphones).

The pen input device 120 (e.g., a stylus pen) may be inserted into or detached from an inner portion of the housing 110 through the hole 121 constructed on the side face of the housing 110, and may include a button for facilitating the detachment. The pen input device 120 may have a separate resonance circuit embedded therein that work with an electromagnetic induction panel 390 (e.g., a digitizer) included in the electronic device 100. The type of the pen input device 120 may be Electro-Magnetic Resonance (EMR), Active Electrical Stylus (AES), or Electric Coupled Resonance (ECR).

Figure 3:
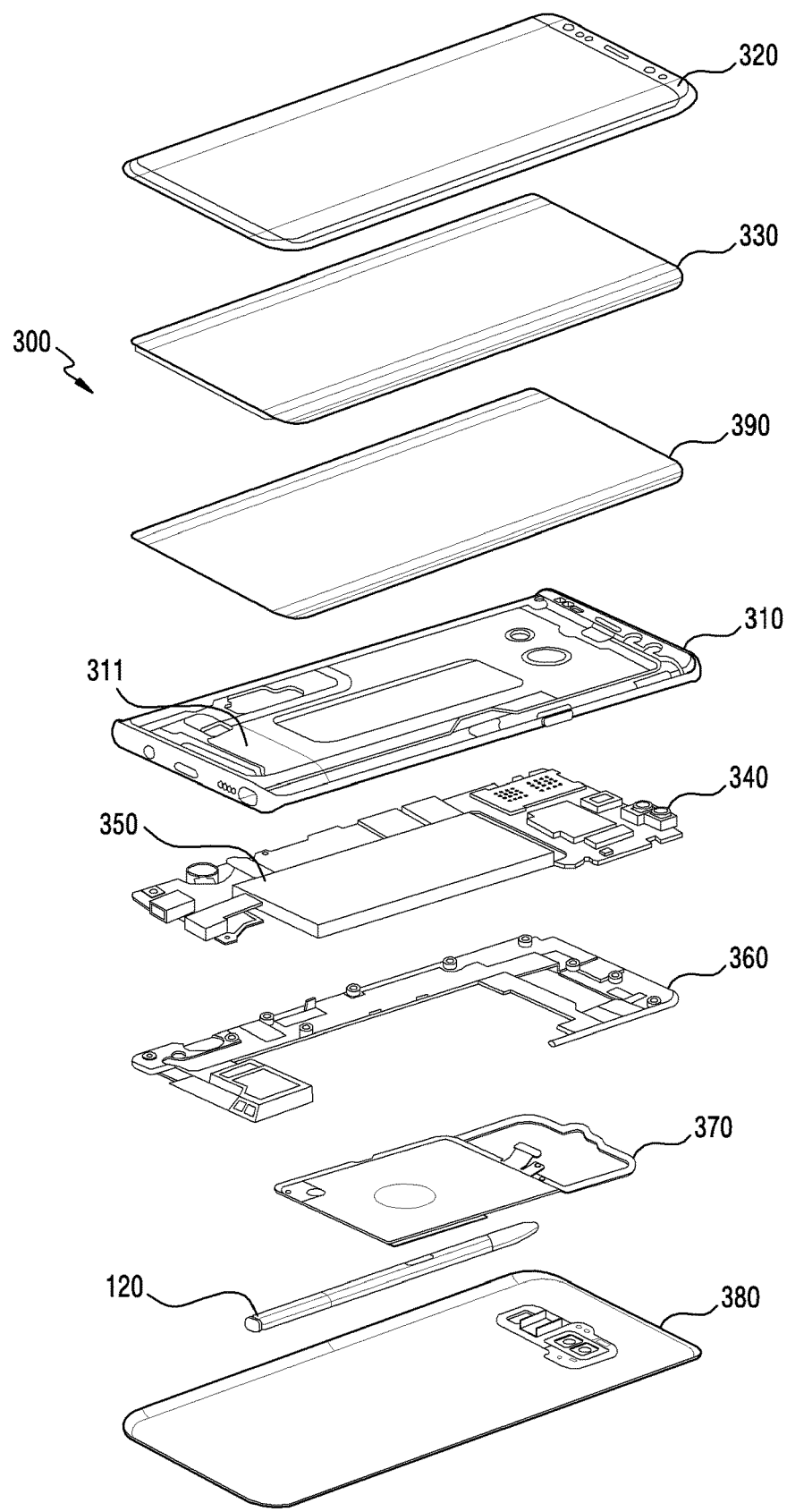
FIG. 3 is an exploded perspective view illustrating an internal structure of the electronic device of FIG. 1.

FIG. 3 is an exploded perspective view illustrating an internal structure of the electronic device of FIG. 1.

Referring to FIG. 3, an electronic device 300 may include a side bezel structure 310, a first support member 311 (e.g., a bracket), a front plate 320, a display 330, an electromagnetic induction panel 390, a Printed Circuit Board (PCB) 340, a battery 350, a second support member 360 (e.g., a rear case), an antenna 370, the pen input device 120, and a rear plate 380. In some embodiments, the electronic device 300 may omit at least one (e.g., the first support member 311 or the second support member 360) of these components, or may additionally include other components. At least one of the components of the electronic device 300 may be the same as or similar to the corresponding component of the electronic device 100 of FIG. 1 or FIG. 2, and redundant descriptions thereof will be omitted hereinafter.

The electromagnetic induction panel 390 (e.g., a digitizer) may be a panel for detecting an input of the pen input device 120. For example, the electromagnetic induction panel 390 may include a Printed Circuit Board (PCB) (e.g., a Flexible Printed Circuit Board (FPCB)) and a shielding sheet. The shielding sheet may prevent mutual interference between components caused by the electromagnetic field generated from the components (e.g., the display module, the PCB, the electromagnetic induction panel, etc.) included in the electronic device 100. The shielding sheet may block the electromagnetic field generated from the components, so that the input from the pen input device 120 is correctly detected by the coil included in the electromagnetic induction panel 390. The electromagnetic induction panel 390 according to certain embodiments may include an opening in a region corresponding to a biometric sensor mounted in the electronic device 100.

The first support member 311 may be coupled with the side bezel structure 310 and be disposed inside the electronic device 300, or may be integrated with the side bezel structure 310. The first support member 311 may be constructed of, for example, a metal material and/or a non-metal (e.g., polymer) material. The first support member 311 may have the display 330 coupled on one face and the PCB 340 coupled on the other face. A processor, a memory, and/or an interface may be mounted on the PCB 340. The processor may include, for example, one or more of a central processing unit, an application processor, a graphic processing unit, an image signal processor, a sensor hub processor, and a communication processor. Further, the processor may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

The memory may include, for example, a volatile memory or a non-volatile memory. The interface may include, for example, a High-Definition Multimedia Interface (HDMI), a Universal Serial Bus (USB) interface, an SD card interface, and/or an audio interface. The interface may electrically and/or physically couple, for example, the electronic device 300 with an external electronic device, and may include a USB connector, an SD card/MMC connector, or an audio connector.

The battery 350 may be a device for supplying power to at least one component of the electronic device 300, and may include, for example, a primary cell which is not rechargeable, a secondary cell which is rechargeable, or a fuel cell. At least part of the battery 350 may be disposed, for example, to be substantially co-planar with the PCB 340. The battery 350 may be disposed inside the electronic device 300, and according to some embodiments, may be detachable from the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform short-range communication, for example, with the external electronic device, or may wirelessly transmit/receive power required for charging. In another embodiment, the antenna structure may include at least part of the side bezel structure 310 and/or the first support member 311 or a combination thereof.

Figure 4:
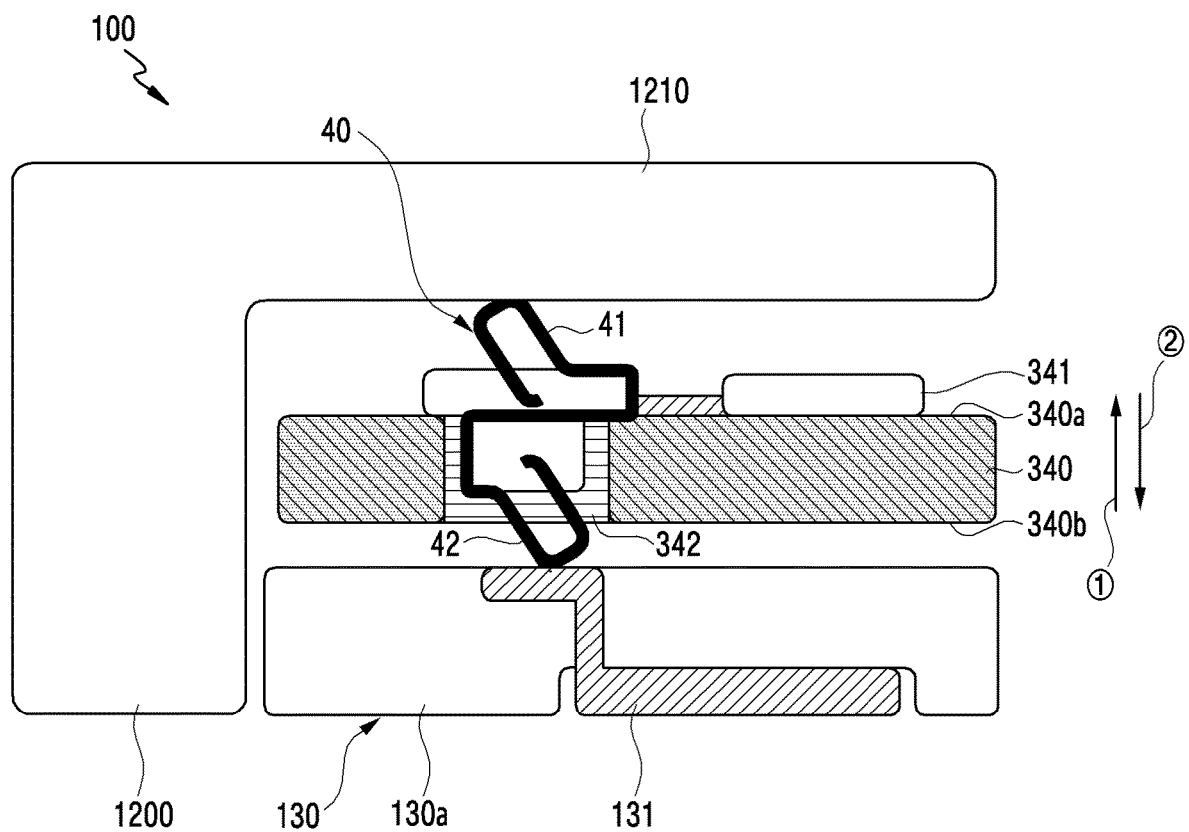
FIG. 4 is a cross-sectional side view illustrating a mounting state of a dual contact member which connects different components mounted in an electronic device according to an embodiment of the disclosure.

FIG. 4 is a cross-sectional side view illustrating a mounting state of a dual contact member which connects different components mounted in an electronic device according to an embodiment of the disclosure.

Referring to FIG. 4, the electronic device 100 according to an embodiment (e.g., the electronic device 100 of FIG. 1) may include a dual contact member 40 which provides an electrical path for electrically connecting different conductive structures. The dual contact member 40 may be a flexible conductive member used as a contact terminal. Hereinafter, the dual contact member 40 may be referred to as a flexible conductive member.

Conductive structures mounted in the electronic device 100 according to one embodiment may include first and second conductive structures 1200 and 130. For example, the first conductive structure 1200 may include a conductive structure having a contact point facing a first direction, and the second conductive structure 130 may include a conductive structure having a contact point facing a second direction opposite to the first direction. The first conductive structure 1200 may be located between a first plate (e.g., the front plate 102 of FIG. 1) and the PCB 340, and the second conductive structure 130 may be located between the PCB 340 and a second plate (e.g., the rear plate 111 of FIG. 1). For example, the first conductive structure 1200 may include a first antenna, and the second conductive structure 130 may include a second antenna.

The first conductive structure 1200 according to an embodiment may include an antenna in which part of the metal housing (e.g., the external metal frame disposed to a side face of the electronic device 100) operates as an antenna radiator in a first band. The second conductive structure 130 may include an internal Laser Direct Structuring (LDS) antenna disposed inside the metal housing and operating at a second band. However, the disclosure is not so limited. In other words, the flexible conductive member 40 is not necessarily restricted to electrically connect different antennas to the PCB 340, and may be more widely utilized as a dual contact terminal which connects two conductors.

The flexible conductive member 40 according to one embodiment may maintain a state where a first flexible portion 41 disposed in the first direction with respect to the PCB 340 is in contact with a conductive protrusion 1210 of the first conductive structure 1200, and may maintain a state where a second flexible portion 42 disposed in the second direction is in contact with a conductive pattern 131 of the second conductive structure 130. The flexible conductive member 40 may be mounted in an insert hole 342 constructed in the PCB 340. The conductive protrusion 1210 may protrude toward a space created between the side member and the first and second plates of the electronic device.

The electronic device 100 according to one embodiment may output a communication signal of a first frequency band simultaneously through an antenna in which the first and second conductive structures 1200 and 130 (e.g., an external metal frame) operate as an antenna radiator and an internal LDS antenna disposed inside the metal housing and operating at a second frequency band. The RF circuitry 341 in the PCB 340 may transmit/receive the communication signal through the antenna and process the signal. The first and second conductive structures 1200 and 130 may support different frequency ranges due to the differences in the physical features of the antenna, but the ranges may overlap so that they share a common frequency band. For example, the antenna constructed as part of the metal housing may operate at a low-band, and the LDS antenna may operate at a mid-band.

The second conductive structure 130 according to one embodiment may include a non-conductive structure 130a. For example, the non-conductive structure 130a may be a mid-plate or an insulator or carrier of a substrate.

The PCB 340 according to one embodiment may include a first face 340a facing the first plate and a second face 340b facing the second plate.

Figure 5A:
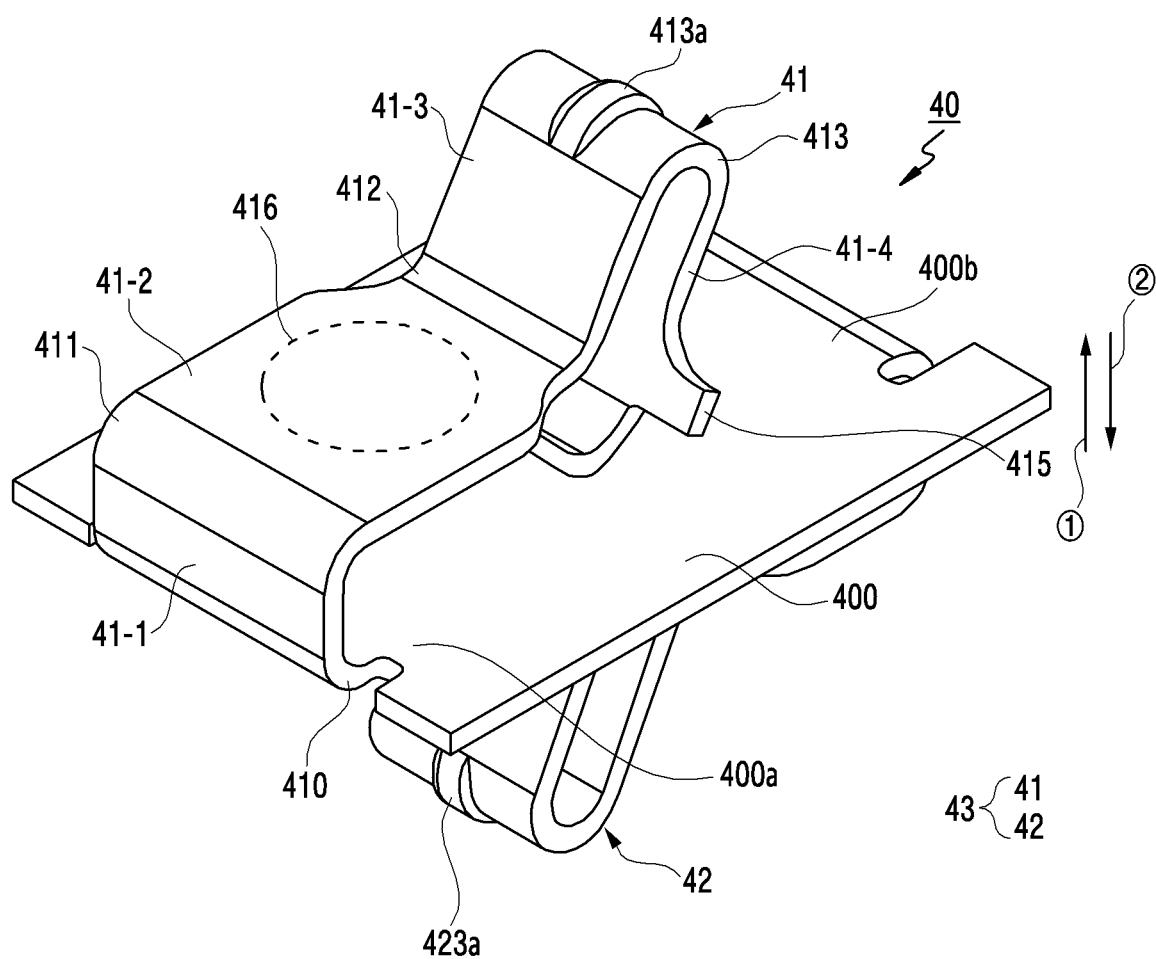
FIG. 5A is a perspective view illustrating a dual contact member according to an embodiment of the disclosure.
Figure 5B:
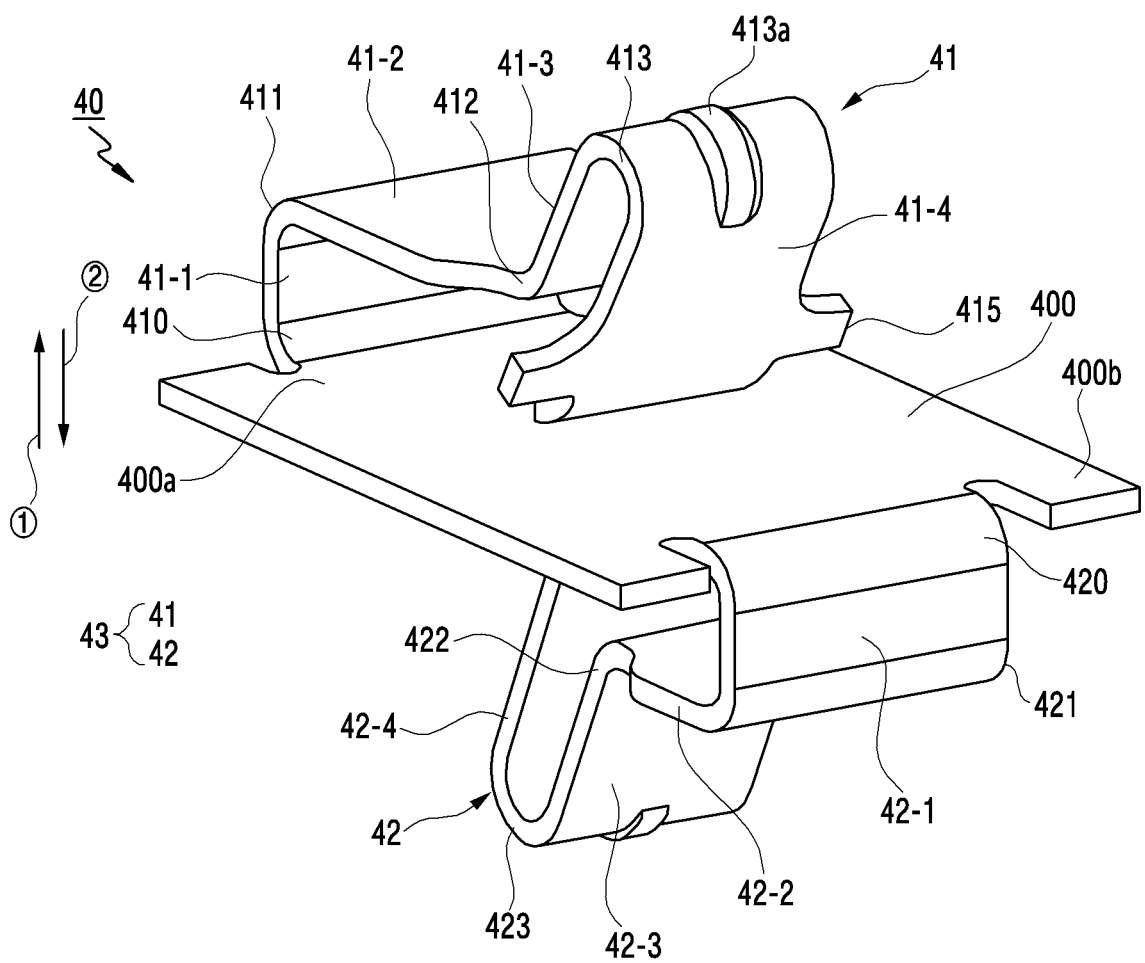
FIG. 5B is a perspective view illustrating a dual contact member according to an embodiment of the disclosure.
Figure 5C:
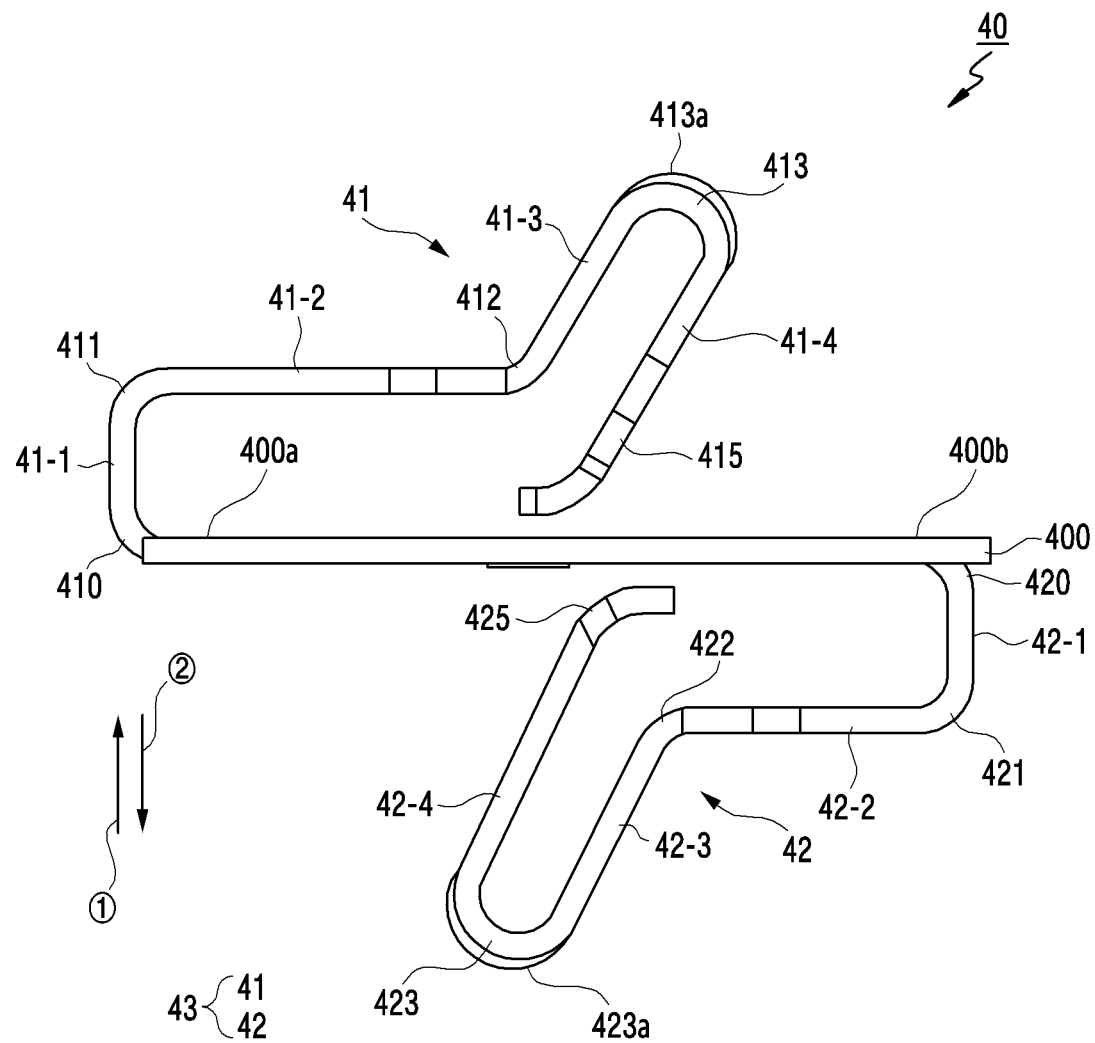
FIG. 5C is a side view illustrating a dual contact member according to an embodiment of the disclosure.

FIG. 5A and FIG. 5B are perspective views each illustrating a dual contact member according to an embodiment of the disclosure. FIG. 5C is a side view illustrating a dual contact member according to an embodiment of the disclosure.

Referring to FIG. 5A, FIG. 5B, and FIG. 5C, the flexible conductive member 40 according to an embodiment, as one contact terminal, may include a base 400 and an elastic conductive portion 43. The base 400 may be a portion supporting the elastic conductive portion 43, and the elastic conductive portion 43 may be a portion providing elasticity force to maintain electrical contact. The base 400 may have a flat shape, and the elastic conductive portion 43 may have a curved shape that includes at least one portion that is bent. Elastic force of the elastic conductive portion 43 may be provided by the bent portions. The base 400 may include a first peripheral portion 400a located in one side region and a second peripheral portion 400b located in the other side region and in parallel to the first peripheral portion 400a. The base 400 may be mounted to a PCB (e.g., the first face 340a of the PCB 340 of FIG. 4).

The elastic conductive portion 43 according to one embodiment may include the first flexible portion 41 disposed in a first direction and the second flexible portion 42 disposed in a second direction opposite to the first direction. The first flexible portion 41 may be made by bending one end portion of the base 400 at least one time, and the second flexible portion 42 may be made by bending the other end portion of the base 400 at least one time. A plurality of first bending portions 410 to 413, for example, which includes bending at four places, may be constructed in the first flexible portion 41, and a plurality of second bending portions 420 to 423, for example, which includes bending at four places, may be constructed in the second flexible portion 42. Although the bending direction of the first bending portions 410 to 413 and the bending direction of the second bending portions 420 to 423 may be opposite, the direction is not limited thereto.

The first flexible portion 41 according to an embodiment may protrude toward a first plate (e.g., the front plate 102 of FIG. 1), and the second flexible portion 42 may protrude toward a second plate (e.g., the rear plate 111 of FIG. 2).

Among the plurality of first bending portions 410 to 413, a first contact point or first contact protrusion 413a, may be constructed in the bending portion 413 that is protruding at the uppermost end of the first flexible portion 41. Among the plurality of second bending portions 420 to 423, a second contact point or second contact protrusion 423a, may be constructed in the bending portion 423 that is protruding at the lowermost end of the second flexible portion 42. The first contact protrusion 413a may be a contact point which is in contact with an antenna that is part of the metal housing, and the second contact protrusion 423a may be a contact point which is in contact with a conductor, e.g., the LDS antenna.

The flexible conductive member 40 according to an embodiment may be bent after being manufactured with a pressing process on one conductive plate, thereby constructing the first and second flexible portions 41 and 42 and the base 400. Thus, the first and second flexible portions 41 and 42 and the base 400 may be integrally constructed.

The first flexible portion 41 according to an embodiment may include a first hook portion 415, and the second flexible portion 42 may include a second hook portion 425. The first hook portion 415 may be restricted in movement by a first stopper structure (not shown) and thus may serve the function of restricting movement of the first flexible portion 41, and the second hook portion 425 may be restricted in movement by a second stopper structure (not shown) and thus serve the function of restricting movement of the second flexible portion 42.

The first flexible portion 41 according to an embodiment may include a first portion 41-1 protruding from the first peripheral portion 400a towards the first plate (e.g., the front plate 102 of FIG. 1), a second portion 41-2 bent from the first portion 41-1 towards the second peripheral portion 400b, a third portion 41-3 bent from the second portion 41-2 towards the first plate, and a fourth portion 41-4 bent from the third portion 41-3 towards the first peripheral portion 400a. In another embodiment (not shown), the first portion 41-1 may be bent from the first peripheral portion 400a to face the first direction. The second portion 41-2 may be bent from the first portion 41-1 to face a direction parallel to the base 400. The third portion 41-3 may be bent from the second portion 41-2 to face an inclined direction. The fourth portion 41-4 may be bent from the third portion 41-3 to face the first peripheral portion 400a.

The second flexible portion 42 according to an embodiment may include a fifth portion 42-1 protruding from the second peripheral portion 400b towards the second plate (e.g., the rear plate 111 of FIG. 1), a sixth portion 42-2 bent from the fifth portion 42-1 towards the first peripheral portion 400a, a seventh portion 42-3 bent from the sixth portion 42-2 towards the second plate, and an eighth portion 42-4 bent from the seventh portion 42-3 towards the second peripheral portion 400b. In another embodiment (not shown), the fifth portion 42-1 may be bent from the second peripheral portion 400b to face the second direction. The sixth portion 42-2 may be bent from the fifth portion 42-1 to face the direction parallel to the base 400. The seventh portion 42-3 may be bent from the sixth portion 42-2 to face the inclined direction. The eighth portion 42-4 may be bent from the seventh portion 42-3 to face a direction parallel to the seventh portion 42-3.

An suction region 416 may be disposed on the second portion 41-2. As shown in FIG. 5A, the second portion 41-2 may be substantially parallel to the base 400. The suction region 416 may be used to mount the flexible conductive member 40 to the PCB 340. Accordingly, the flexible conductive member 40 may be a Surface Mount Device (SMD) on the PCB 340. Alternatively, the suction region may be disposed on the sixth portion 42-2.

Figure 6A:
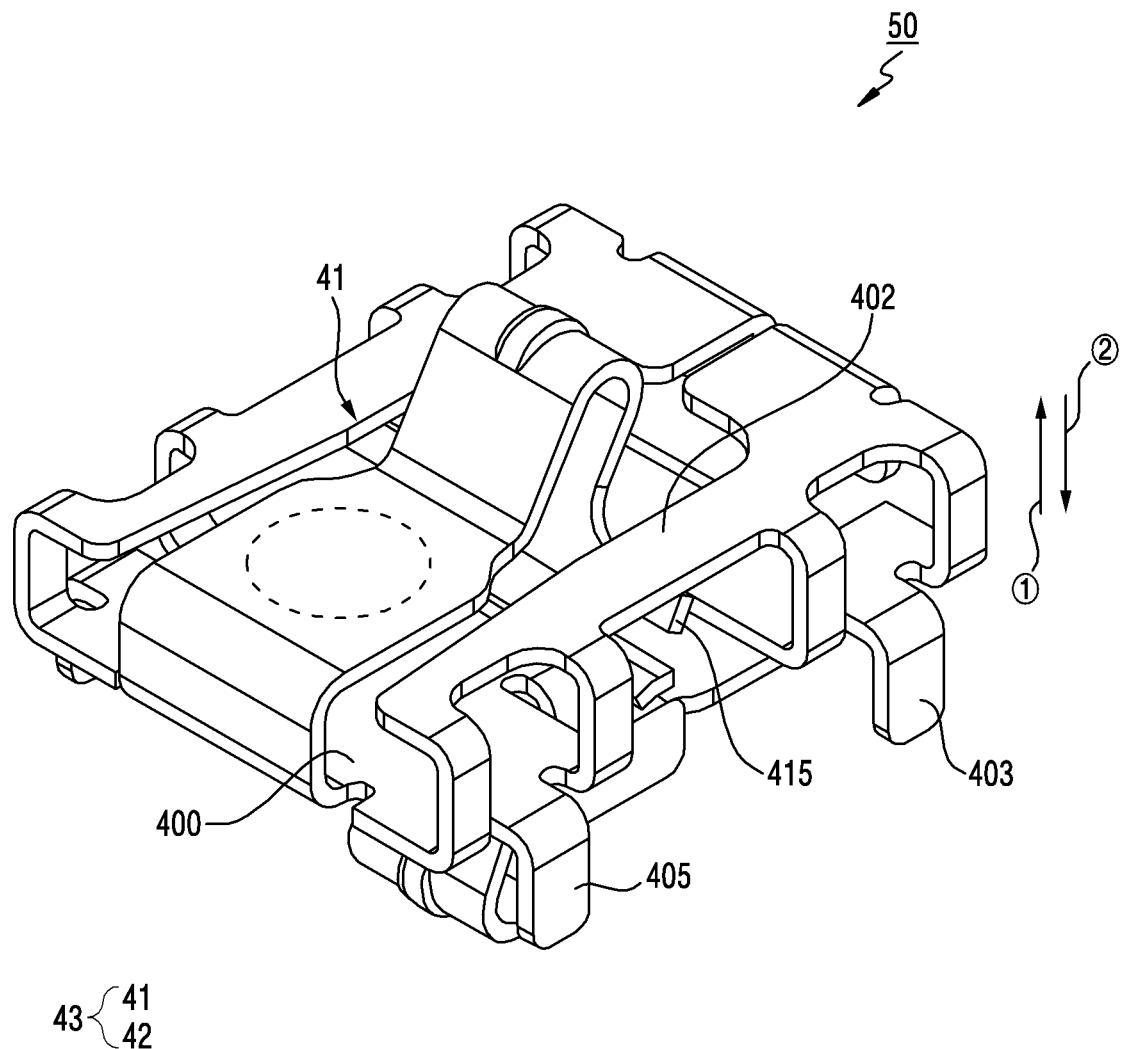
FIG. 6A is a perspective view illustrating a dual contact member according to an embodiment of the disclosure.
Figure 6B:
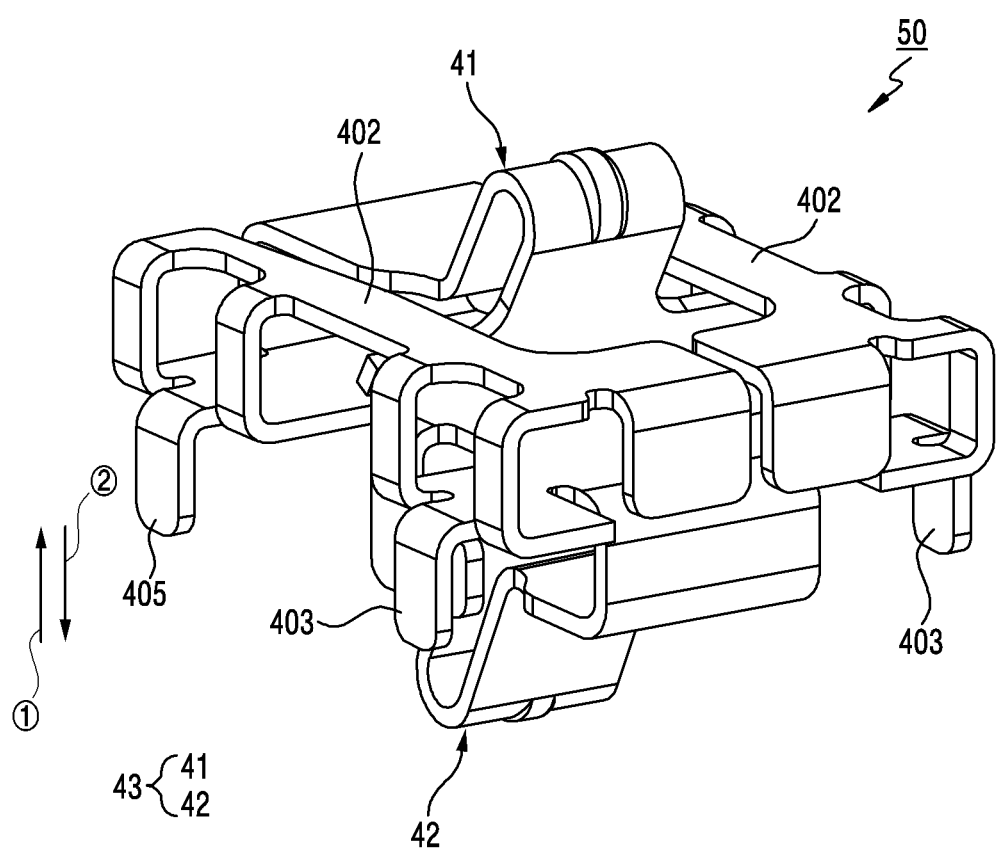
FIG. 6B is a perspective view illustrating a dual contact member according to an embodiment of the disclosure.
Figure 6C:
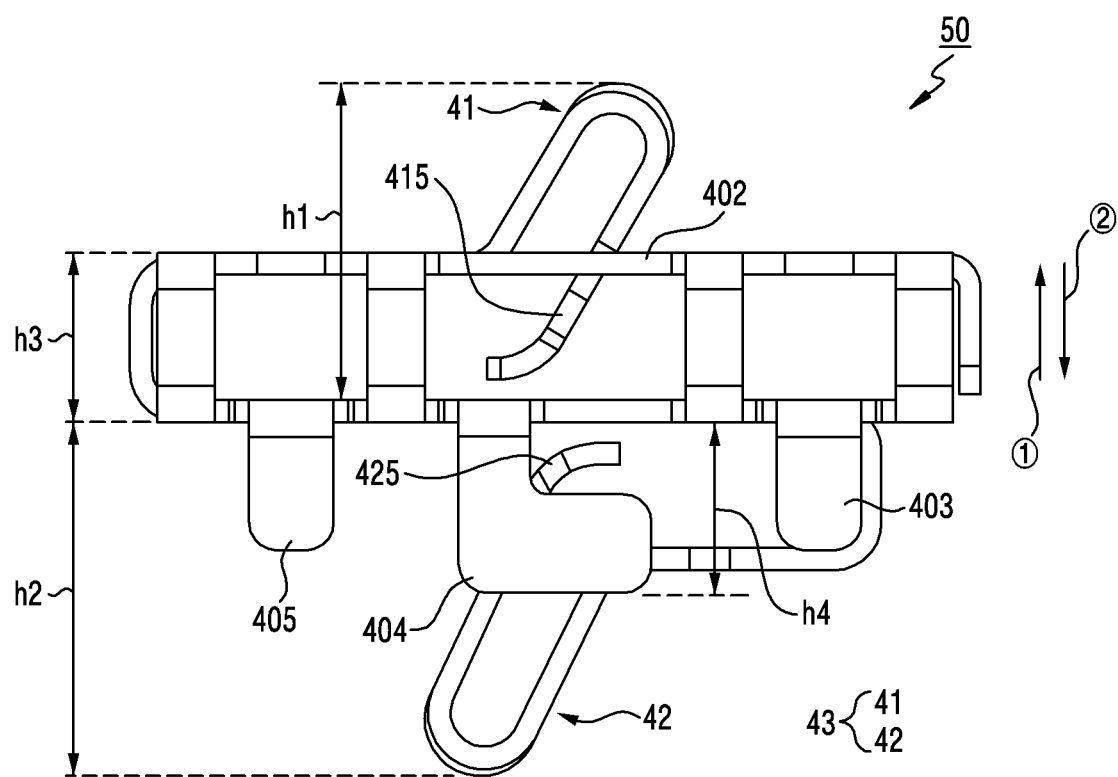
FIG. 6C is a side view illustrating a dual contact member according to an embodiment of the disclosure.

FIG. 6A and FIG. 6B are perspective views each illustrating a dual contact member according to an embodiment of the disclosure. FIG. 6C is a side view illustrating a dual contact member according to an embodiment of the disclosure.

Referring to FIG. 6A, FIG. 6B, and FIG. 6C, a flexible conductive member 50 according to an embodiment will be described only in terms of its differences from the flexible conductive member 40 of FIG. 5A, FIG. 5B, and FIG. 5C, and descriptions of their similarities will be omitted to avoided redundancy. The elastic conductive portion of the flexible conductive member 50 has the same structure as the elastic conductive portion 43 of the flexible conductive member of FIG. 5A, FIG. 5B, and FIG. 5C, and thus detailed descriptions of the elastic conductive portion will be omitted.

The flexible conductive member 50 according to an embodiment may include the elastic conductive portion 43 and the base 400. The flexible conductive member 50 according to an embodiment may include at least one stopper constructed by being bent from the base 400. The stopper may include a first stopper structure 402 disposed in a first direction of the base 400 and a second stopper structure 404 disposed in a second direction of the base 400. The first stopper structure 402 may be constructed by bending a portion of the base 400 at least one time in the first direction and may restrict movement of the first hook portion 415. The second stopper structure 404 may be constructed by bending the base 400 at least one time in the second direction and may restrict movement of the second hook portion 425.

The base 400 according to an embodiment may have at least one or more contact pins 403 and 405 constructed in the second direction. The contact pins 403 and 405 may include the first contact pin 403 bent in the second direction from the base 400 and the second contact pin 405 bent in the second direction from the base 400 and separated from the first contact pin 403. The first and second contact pins 403 and 405 may allow the flexible conductive member 50 to be in contact with and fixed to a PCB (e.g., the PCB 340 of FIG. 4). Each of the first and second contact pins 403 and 405 may include a pair of pins. When the flexible conductive member 50 is mounted to the PCB, each of the first and second contact pins 403 and 405 may be inserted into an insert hole constructed in the PCB. Each of the first and second contact pins 403 and 405 may have a shape extending in the second direction.

Referring to FIG. 6C, the first flexible portion 41 according to an embodiment may be constructed to have a first height h1 from the base 400, and the second flexible portion 42 may be constructed to have a second height h2 from the base 400. The first and second heights h1 and h2 may be constructed to be the same as or different from each other. The first stopper structure according to an embodiment may be constructed to have a third height h3 from the base 400, and the second stopper structure may be constructed to have a fourth height h4 from the base 400.

For example, the third height h3 may be less than the first height h1, and the fourth height h4 may be less than the second height h2. In addition, the fourth height h4 may be greater than the third height h3. Further, the fourth height h4 may be less than the thickness of a PCB (e.g., the PCB 340 of FIG. 4).

Figure 7A:
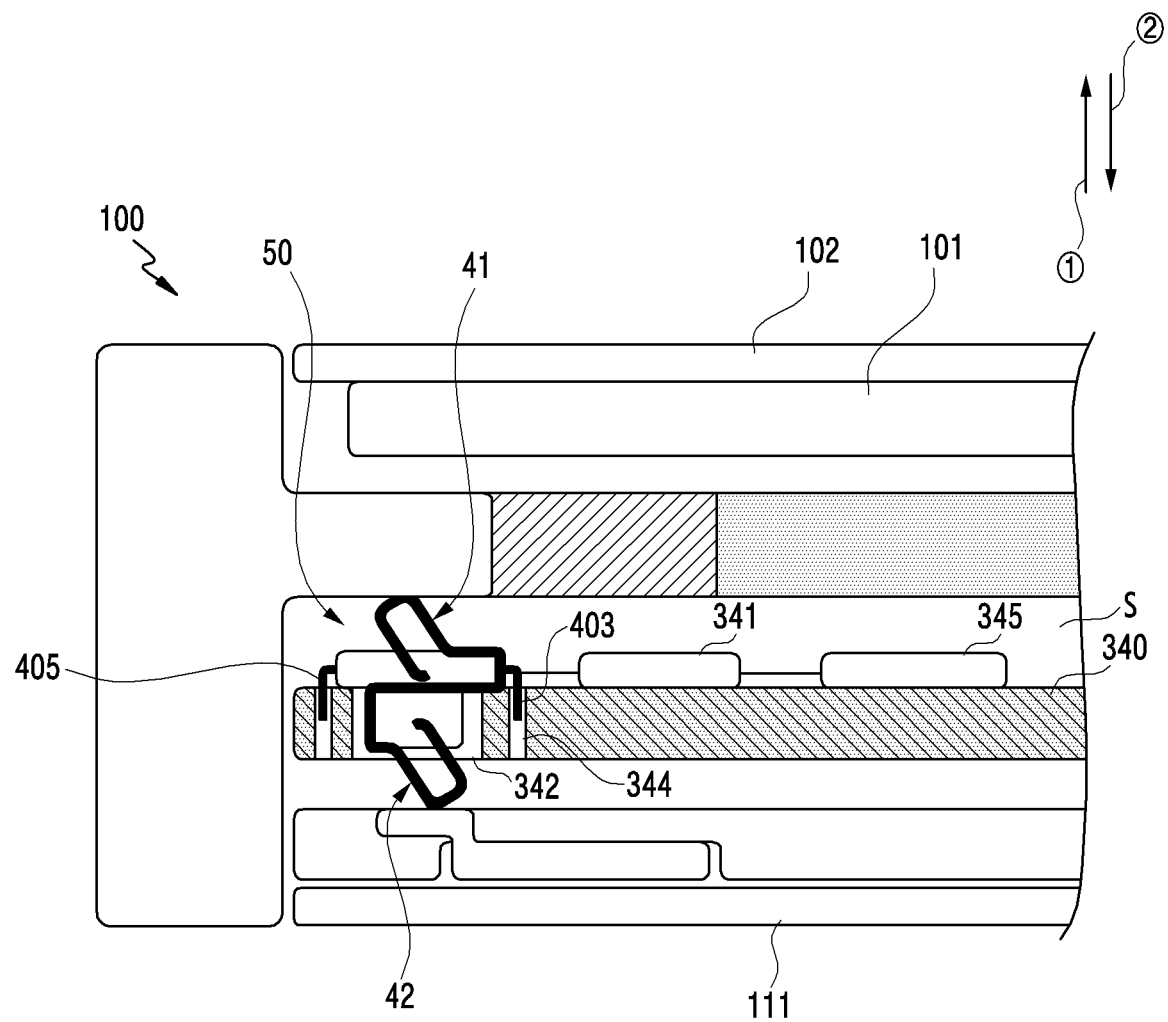
FIG. 7A is a cross-sectional side view illustrating a mounting state of a dual contact member according to an embodiment of the disclosure.
Figure 7B:
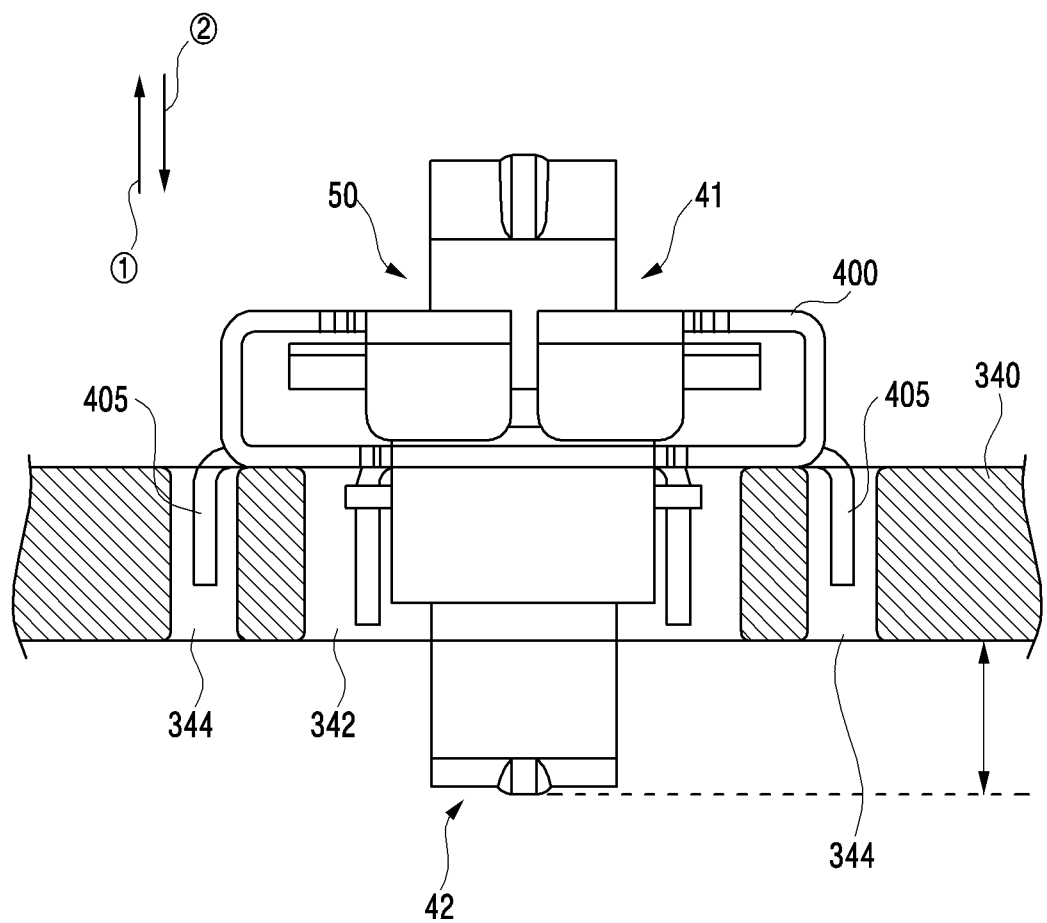
FIG. 7B is an enlarged cross-sectional front view illustrating a mounting state of a dual contact member according to an embodiment of the disclosure.

FIG. 7A is a cross-sectional side view illustrating a mounting state of a dual contact member according to an embodiment of the disclosure. FIG. 7B is an enlarged cross-sectional front view illustrating a mounting state of a dual contact member according to an embodiment of the disclosure.

Referring to FIG. 7A and FIG. 7B, the electronic device 100 according to an embodiment will be described only in terms of its differences from the electronic device 100 of FIG. 4, and descriptions of their similarities will be omitted to avoided redundancy. The flexible conductive member 50 according to an embodiment may be mounted to the PCB 340 using Surface Mounting Technology (SMT). For this, at least one insert hole 342 and at least one pin hole 344 may be constructed on the PCB 340. The insert hole 342 may be an opening through which the second flexible portion 42 of the flexible conductive member 50 is inserted and fixed, and the pin hole 344 may be an opening through which the first and second contact pins 403 and 405 of the flexible conductive member are inserted and fixed. The insert hole 342 may be constructed to have enough space for the second flexible portion 42, and each pin hole 344 may be constructed to have enough space for the insertion and soldering of the first and second contact pins 403 and 405. Each of the insert hole 342 and the pin hole 344 may have a shape extending in a vertical direction. Each pin hole 344 may electrically connect and physically fix the first and second contact pins 403 and 405 to the RF circuitry 341 mounted to the PCB 340 by filling a solder through a soldering process. The RF circuitry 341 may be controlled in the PCB 340 by being electrically connected by the processor 345.

If the flexible conductive member 50 according to an embodiment is mounted to the PCB 340, the first flexible portion 41 may be disposed in a first direction with respect to an upper face of the PCB 340, and the second flexible portion 42 and the first and second contact pins 403 and 305 may be disposed in a second direction. In FIG. 7A, the reference numeral 102 may indicate the front plate which may be a window. The reference numeral 111 may indicate the rear plate which may be the back cover of the electronic device.

Figure 8A:
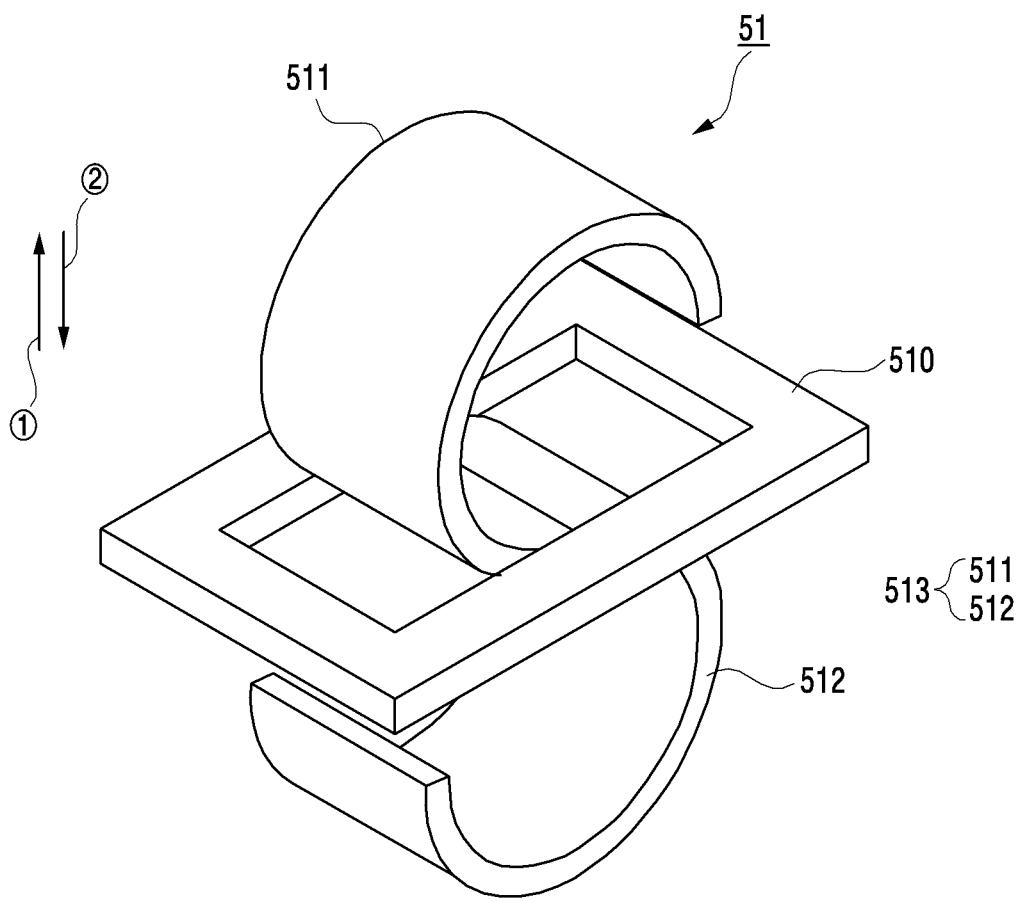
FIG. 8A is a perspective view illustrating an alphabet S shaped dual contact member according to an embodiment of the disclosure.
Figure 8B:
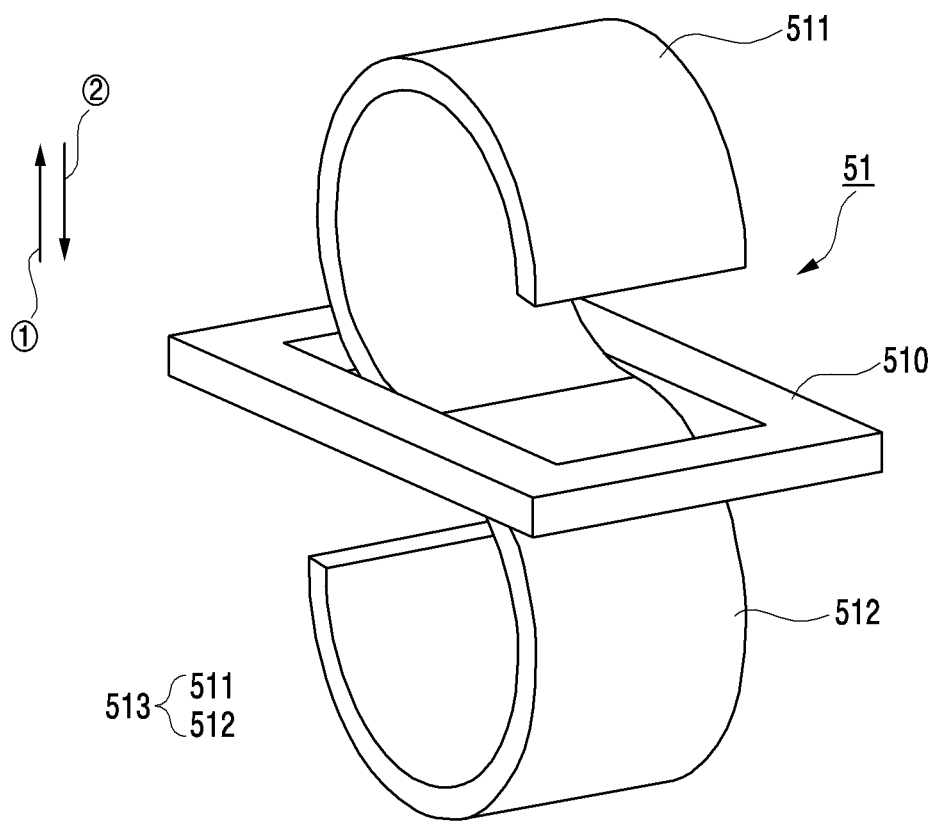
FIG. 8B is a perspective view illustrating an alphabet S shaped dual contact member according to an embodiment of the disclosure.
Figure 8C:
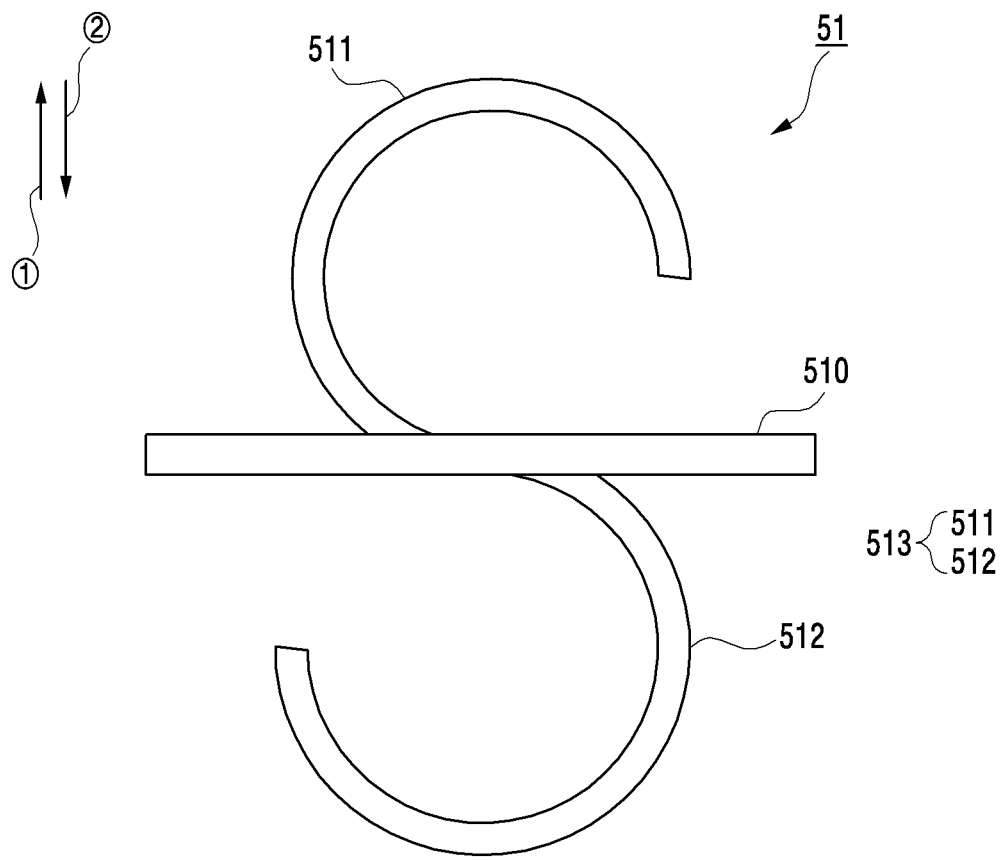
FIG. 8C is a side view illustrating an alphabet S shaped dual contact member according to an embodiment of the disclosure.

FIG. 8A and FIG. 8B are perspective views each illustrating an alphabet S shaped dual contact member according to an embodiment of the disclosure. FIG. 8C is a side view illustrating an alphabet S shaped dual contact member according to an embodiment of the disclosure.

Referring to FIG. 8A, FIG. 8B, and FIG. 8C, a flexible conductive member 51 according to one embodiment (corresponding to the flexible conductive member 40 of FIG. 4) may include a base 510 and an elastic conductive portion 513. The base 510 may be a portion which supports the elastic conductive portion 513, and the elastic conductive portion 513 may be a portion which provides elastic force for maintaining electrical contact. The base 510 may have a flat shape, and the elastic conductive portion 513 may have a curved shape. Elastic force of the elastic conductive portion 513 may be implemented due to its curved shape.

The elastic conductive portion 513 may have an alphabet S shape, and may include a first flexible portion 511 disposed in a first direction and a second flexible portion 512 disposed in a second direction opposite to the first direction. The first flexible portion 511 may have a curved shape by being bent from the base 510, and the second flexible portion 512 may have a curved shape by being bent from the base 510. For example, the first flexible portion 511 individually may have an alphabet C shape, and the second flexible portion 512 individually may have an alphabet C shape. The first and second flexible portions 511 and 512 may be integrally constructed.

Figure 9A:
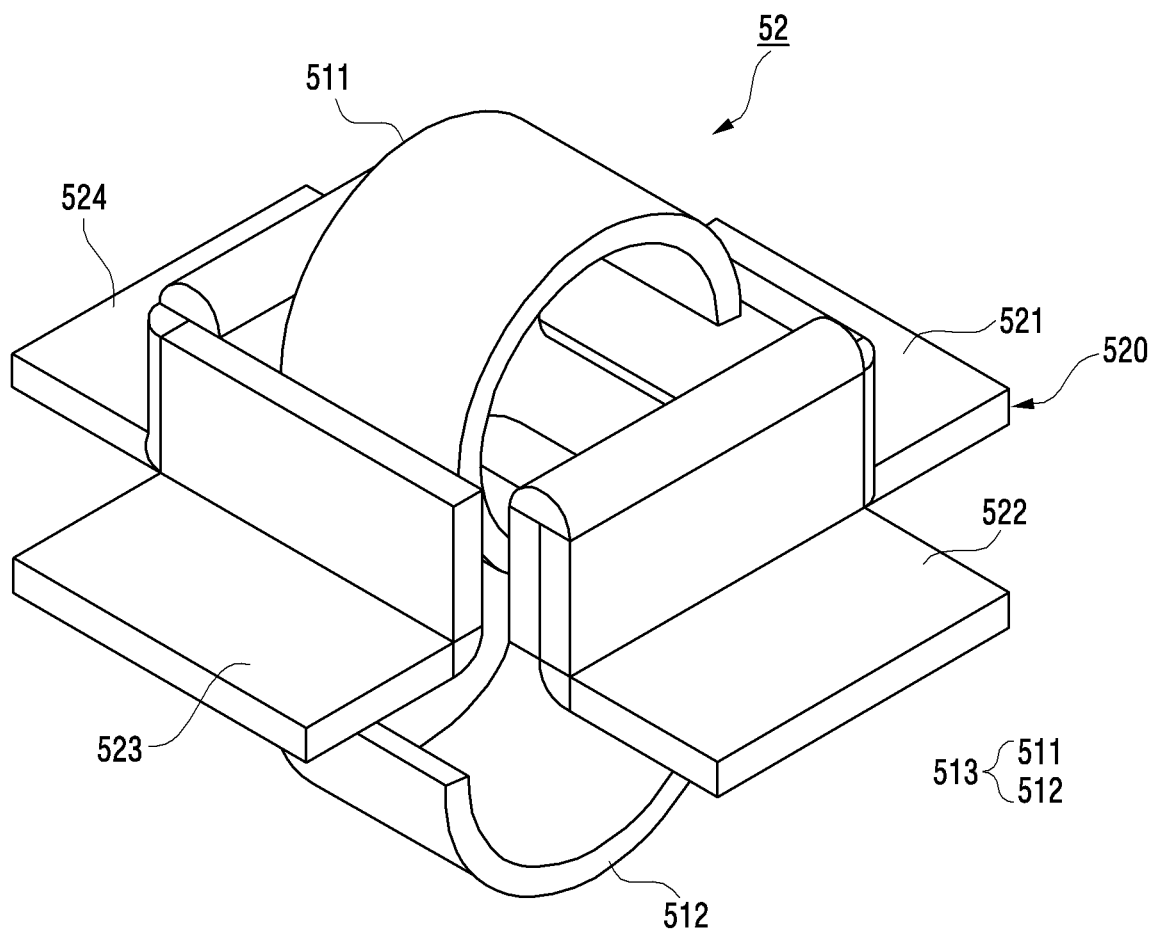
FIG. 9A is a perspective view illustrating an alphabet S shaped dual contact member according to an embodiment of the disclosure.
Figure 9B:
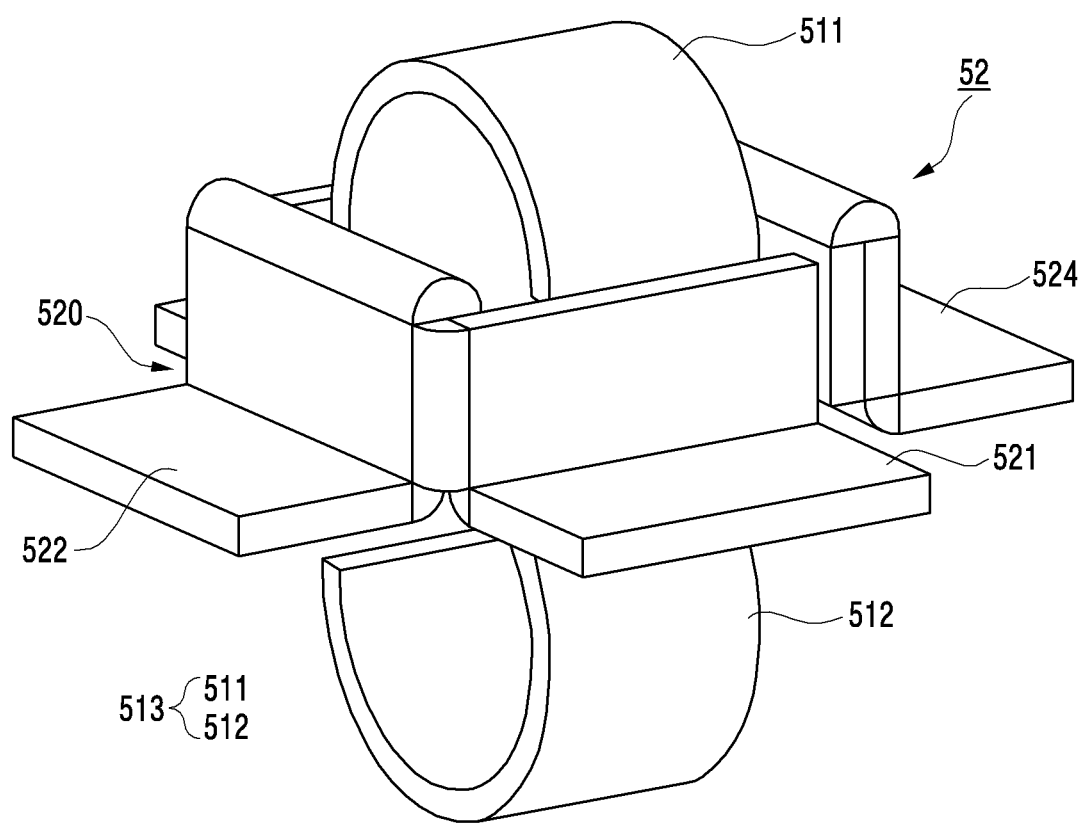
FIG. 9B is a perspective view illustrating an alphabet S shaped dual contact member according to an embodiment of the disclosure.
Figure 9C:
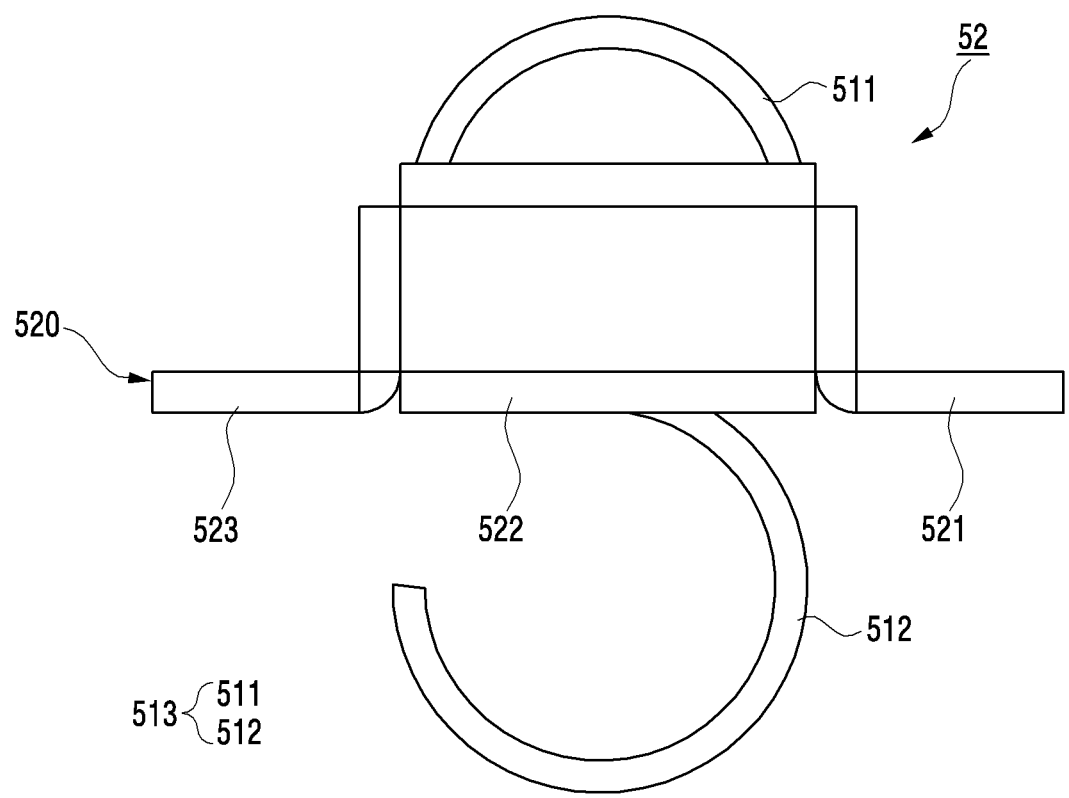
FIG. 9C is a side view illustrating an alphabet S shaped dual contact member according to an embodiment of the disclosure.

FIG. 9A and FIG. 9B are perspective views each illustrating an alphabet S shaped dual contact member according to an embodiment of the disclosure. FIG. 9C is a side view illustrating an alphabet S shaped dual contact member according to an embodiment of the disclosure.

Referring to FIG. 9A, FIG. 9B, and FIG. 9C, a flexible conductive member 52 according to an embodiment will be described only in terms of its differences from the flexible conductive member 51 of FIG. 8A, FIG. 8B, and FIG. 8C, and descriptions of their similarities will be omitted to avoided redundancy. Since the alphabet S shaped elastic conductive portion 513 of the flexible conductive member 52 is constructed in the same manner as the alphabet S shaped elastic conductive portion 513 of the flexible conductive member 51 of FIG. 8A, FIG. 8B, and FIG. 8C, detailed descriptions of the S shaped elastic conductive portion 513 will be omitted.

The base 520 according to the embodiment shown in FIG. 9A, FIG. 9B, and FIG. 9C may be constructed in a shape surrounding the S shaped elastic conductive portion 513 in four directions. The base 520 may include first to fourth bases 521 to 524. Each of the first to fourth bases 521 to 524 may be constructed in a shape including a horizontal portion and a vertical portion. The horizontal portion or vertical portion of each of the first to fourth bases 521 to 524 may be constructed by bending the base 520.

Figure 10A:
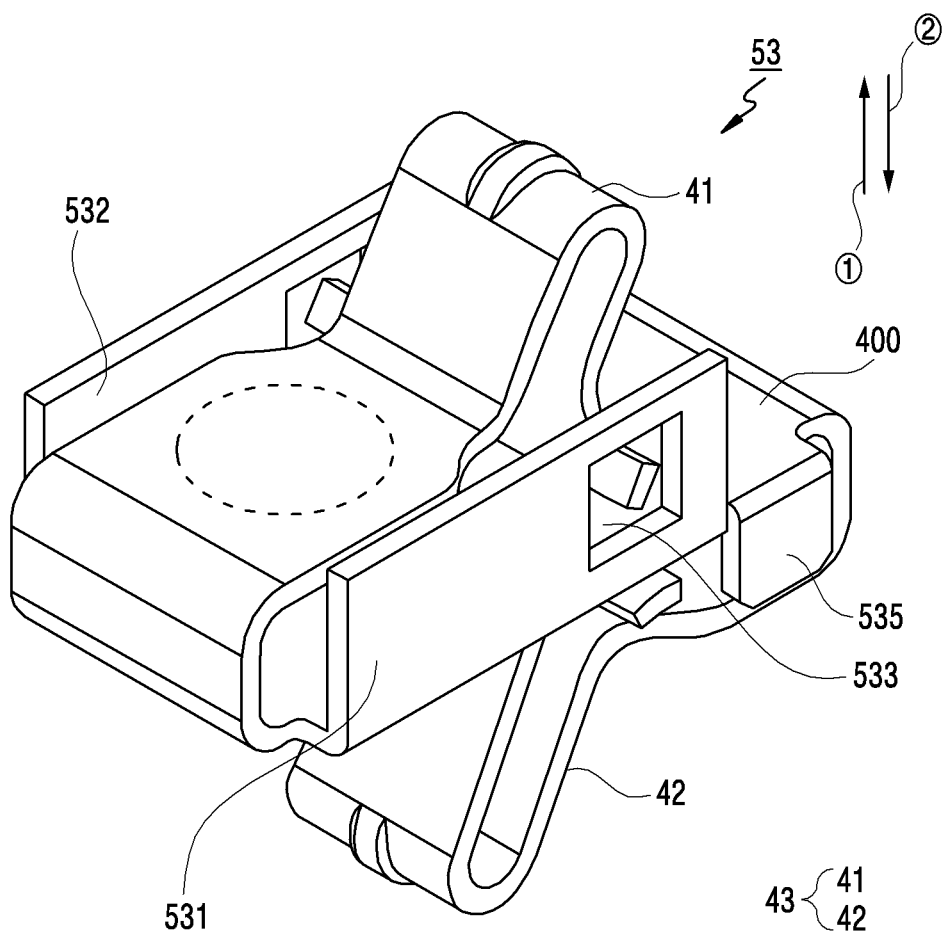
FIG. 10A is a perspective view illustrating a dual contact member according to an embodiment of the disclosure.
Figure 10B:
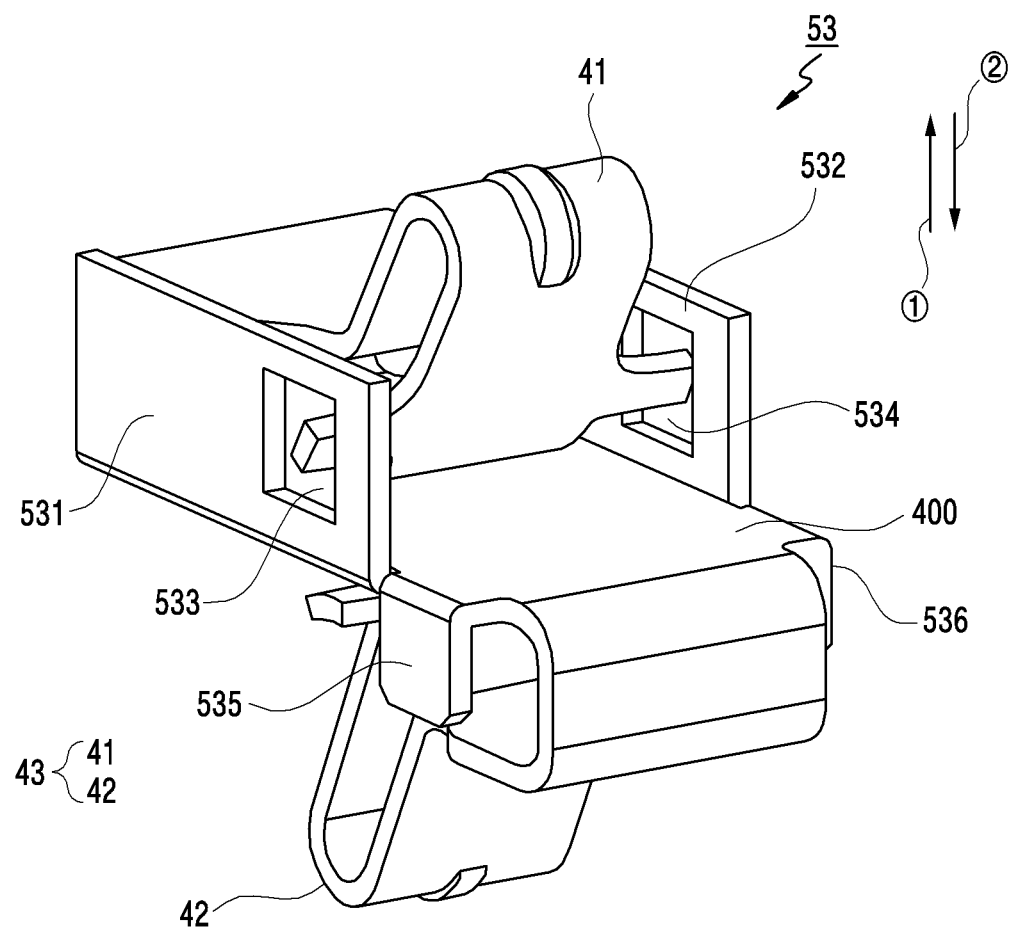
FIG. 10B is a perspective view illustrating a dual contact member according to an embodiment of the disclosure.
Figure 10C:
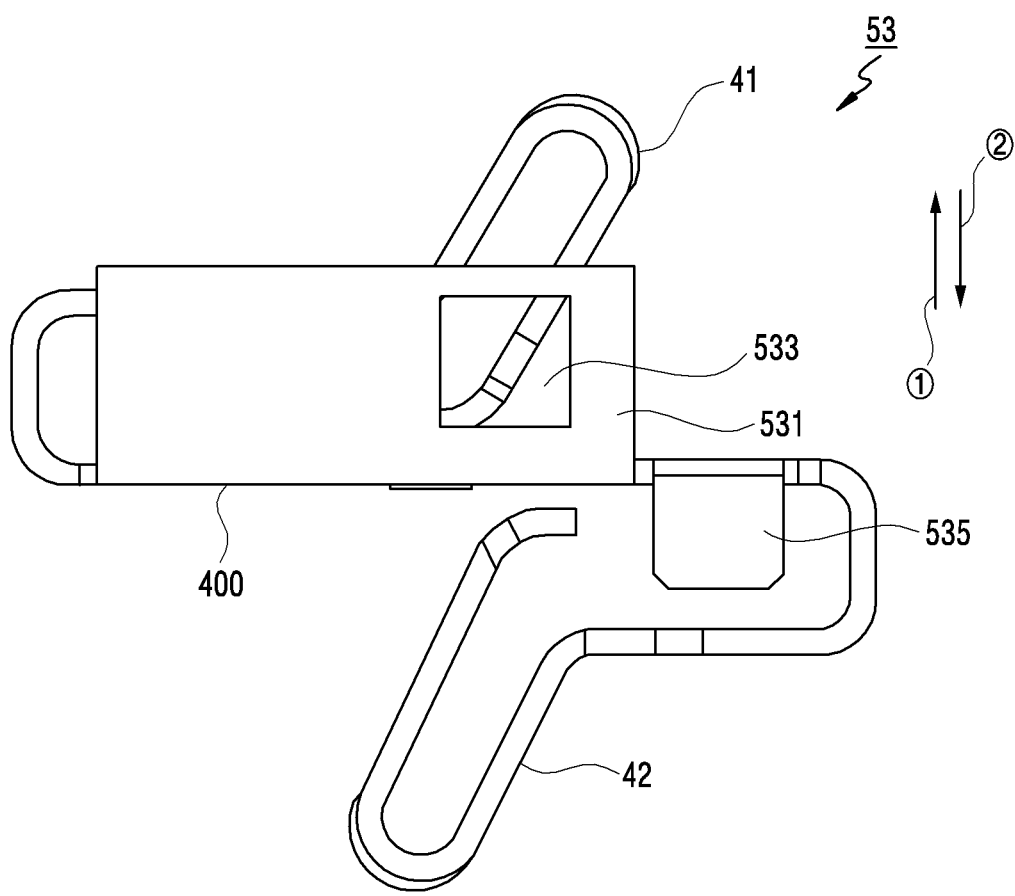
FIG. 10C is a side view illustrating a dual contact member according to an embodiment of the disclosure.

FIG. 10A and FIG. 10B are perspective views each illustrating a dual contact member according to an embodiment of the disclosure. FIG. 10C is a side view illustrating a dual contact member according to an embodiment of the disclosure.

Referring to FIG. 10A, FIG. 10B, and FIG. 10C, a flexible conductive member 53 according to an embodiment will be described only in terms of its differences from the flexible conductive member 50 of FIG. 6A, FIG. 6B, and FIG. 6C, and descriptions of their similarities will be omitted to avoided redundancy. Since the elastic conductive portion of the flexible conductive member 53 is constructed in the same manner as the elastic conductive portion 43 of the flexible conductive member 50 of FIG. 6A, FIG. 6B, and FIG. 6C, detailed descriptions of the elastic conductive portion will be omitted.

The base 400 according to an embodiment may include a first stopper structure 531 disposed in a first direction and a second stopper structure 532 facing the first stopper structure 531. The first stopper structure 531 may include a first opening 533 which restricts movement of a first hook portion provided in a first flexible portion. The second stopper structure 532 may include a second opening 534 which restricts movement of the first hook portion provided in the first flexible portion. The first stopper structure 531 may be constructed in the base 400 as a vertical wall in a vertical upward direction, and the second stopper structure 532 may be constructed in the base 400 similarly. The first and second stopper structures 531 and 532 may be constructed by being bent respectively at two ends of the base 400.

The base 400 according to an embodiment may include first and second contact pins 535 and 536 disposed in the second direction. The first contact pin 535 may protrude in the second direction, and the second contact pin 536 may protrude in the second direction while facing the first contact pin 535. For example, the first and second contact pins 535 and 536 may be electrically connected to an RF circuitry (e.g., the RF circuitry 341 of FIG. 7A) via soldering after being inserted to a contact pin hole (e.g., the pin hole 344 of FIG. 7A) constructed on a PCB, and may be fixed on the PCB.

Figure 11A:
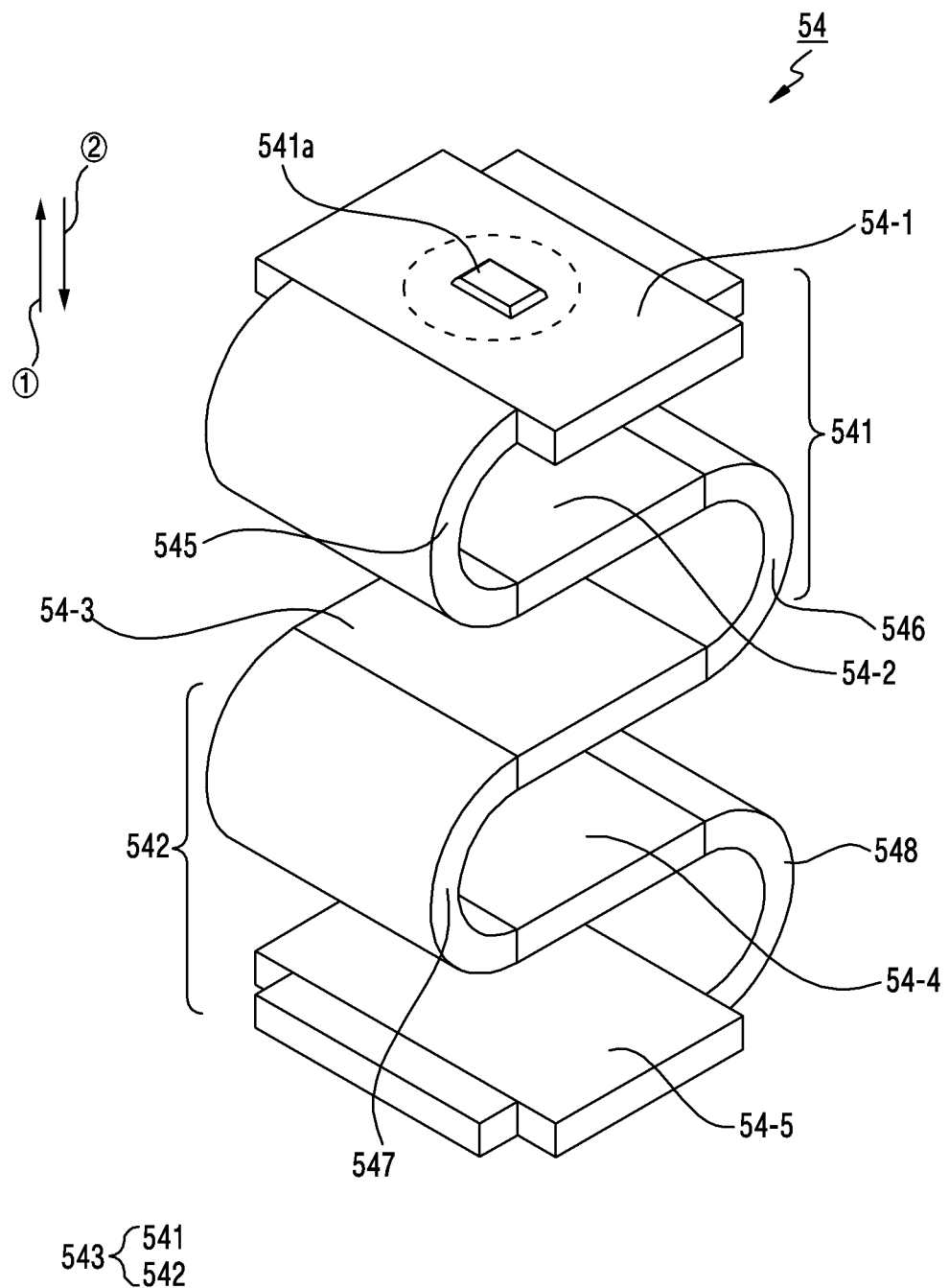
FIG. 11A is a perspective view illustrating a double alphabet S shaped dual contact member according to an embodiment of the disclosure.
Figure 11B:
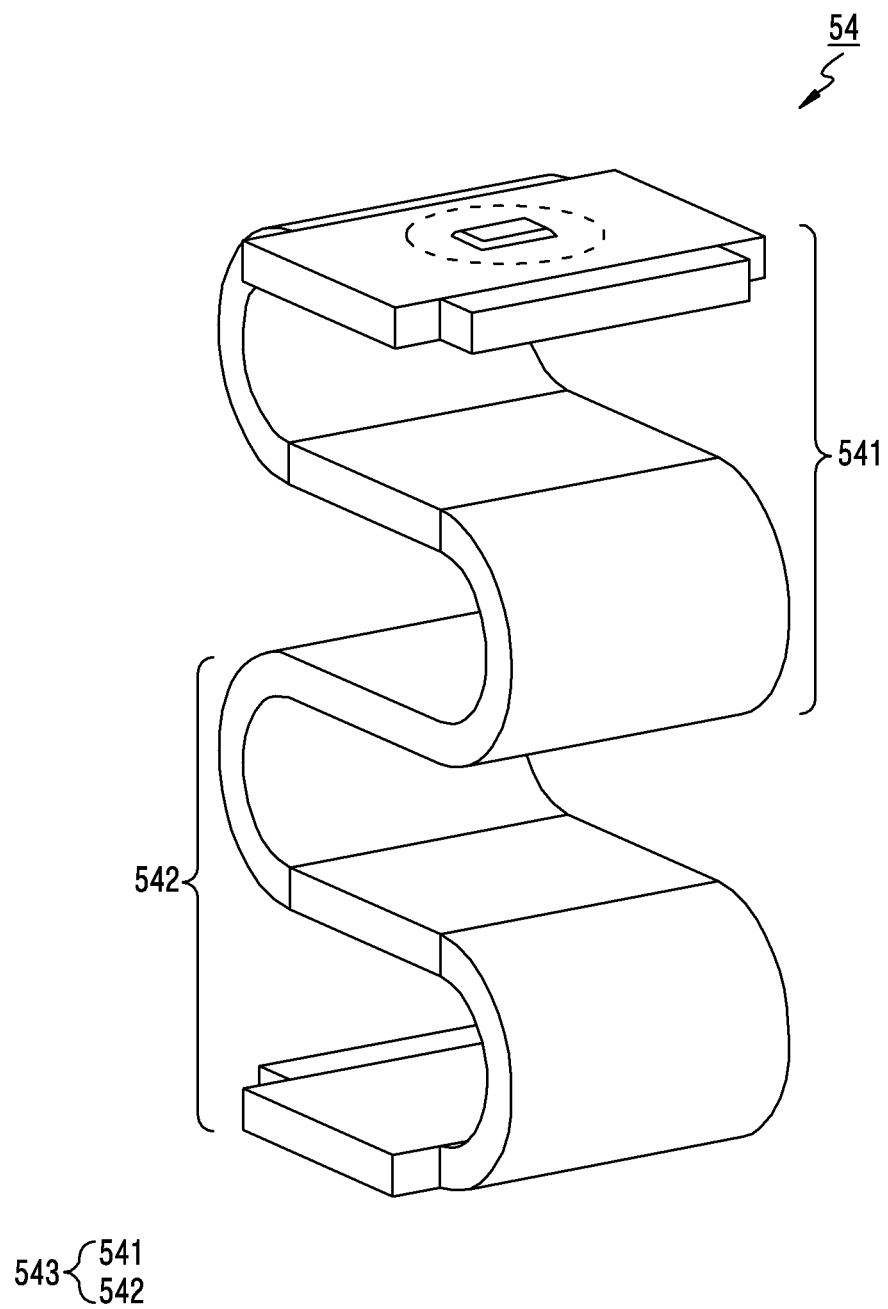
FIG. 11B is a perspective view illustrating a double alphabet S shaped dual contact member according to an embodiment of the disclosure.
Figure 11C:
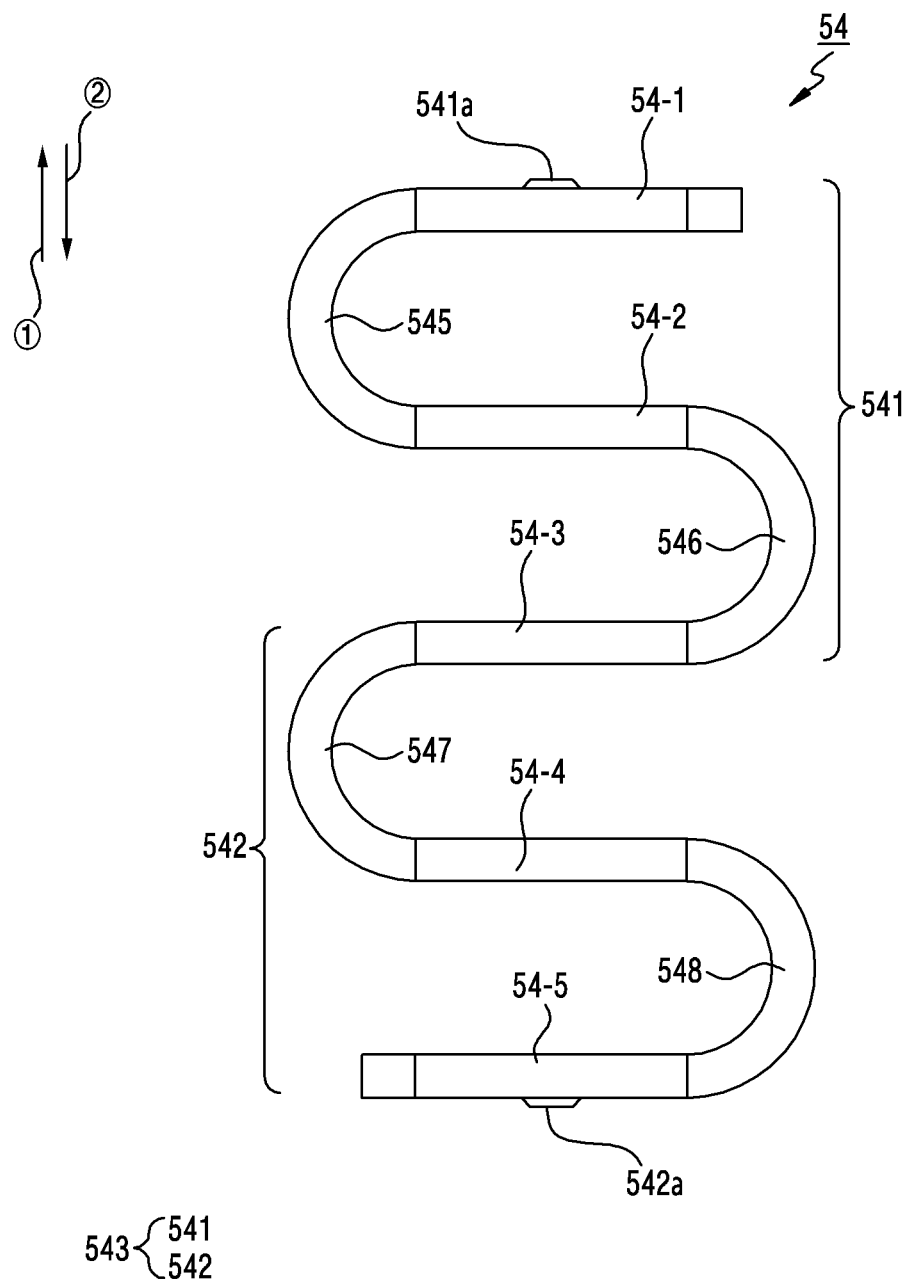
FIG. 11C is a side view illustrating a double alphabet S shaped dual contact member according to an embodiment of the disclosure.

FIG. 11A and FIG. 11B are perspective views each illustrating a double alphabet S shaped dual contact member according to an embodiment of the disclosure. FIG. 11C is a side view illustrating a double alphabet S shaped dual contact member according to an embodiment of the disclosure.

Referring to FIG. 11A, FIG. 11B, and FIG. 11C, a flexible conductive member 54 according to an embodiment (corresponding to the flexible conductive member 40 of FIG. 4) may include a plurality of bent elastic conductive portions 543. The elastic conductive portion 543 may have an SS shape in which two portions in alphabet S shapes are connected in a vertical direction, and may include a first flexible portion 541 facing a first direction with respect to a PCB and a second flexible portion 542 facing a second direction. For example, the first flexible portion 541 may have an alphabet S shape, and the second flexible portion 542 may have the alphabet S shape.

The elastic conductive portion 543 according to an embodiment may include the first flexible portion 541 and the second flexible portion 542 connected integrally in the vertical direction. The first flexible portion 541 may include a first portion 54-1, a second portion 54-2 bent from the first portion 54-1 in the second direction, and a third portion 54-3 bent from the second portion 54-2 in the second direction. In addition, the first flexible portion 541 may have a first bending portion 545 located between the first and second portions 54-1 and 54-2 and a second bending portion 546 located between the second and third portions 54-2 and 54-3. The second flexible portion 542 may include the third portion 54-3, a fourth portion 54-4 bent from the third portion 54-3 in the second direction, and a fifth portion 54-5 bend from the fourth portion 54-4 in the second direction. In addition, the second flexible portion 542 may have a third bending portion 547 located between the third and fourth portions 54-3 and 54-4 and a fourth bending portion 548 located between the fourth and fifth portions 54-4 and 54-5. The third portion 54-3 may be the portion that is shared by the first and second flexible portions 541 and 542. In other words, the first and second flexible portions 541 and 542 are connected to each other through the third portion 54-3. A first contact point 541a may protrude from a first face facing the first direction of the first portion 54-1, and a second contact point 542a may protrude from a second face facing the second direction of the fifth portion 54-5.

The elastic conductive portion 543 according to an embodiment may maintain a state where each of the first and fifth portions 54-1 and 54-5 are in contact with the first and second conductive structures due to elastic force provided by the first to fourth bending portions 545 to 548 of four places. Substantially, the first to fifth portions 54-1 and 54-5 may be in a state of being parallel to each other, and may maintain the parallel state.

Figure 12A:
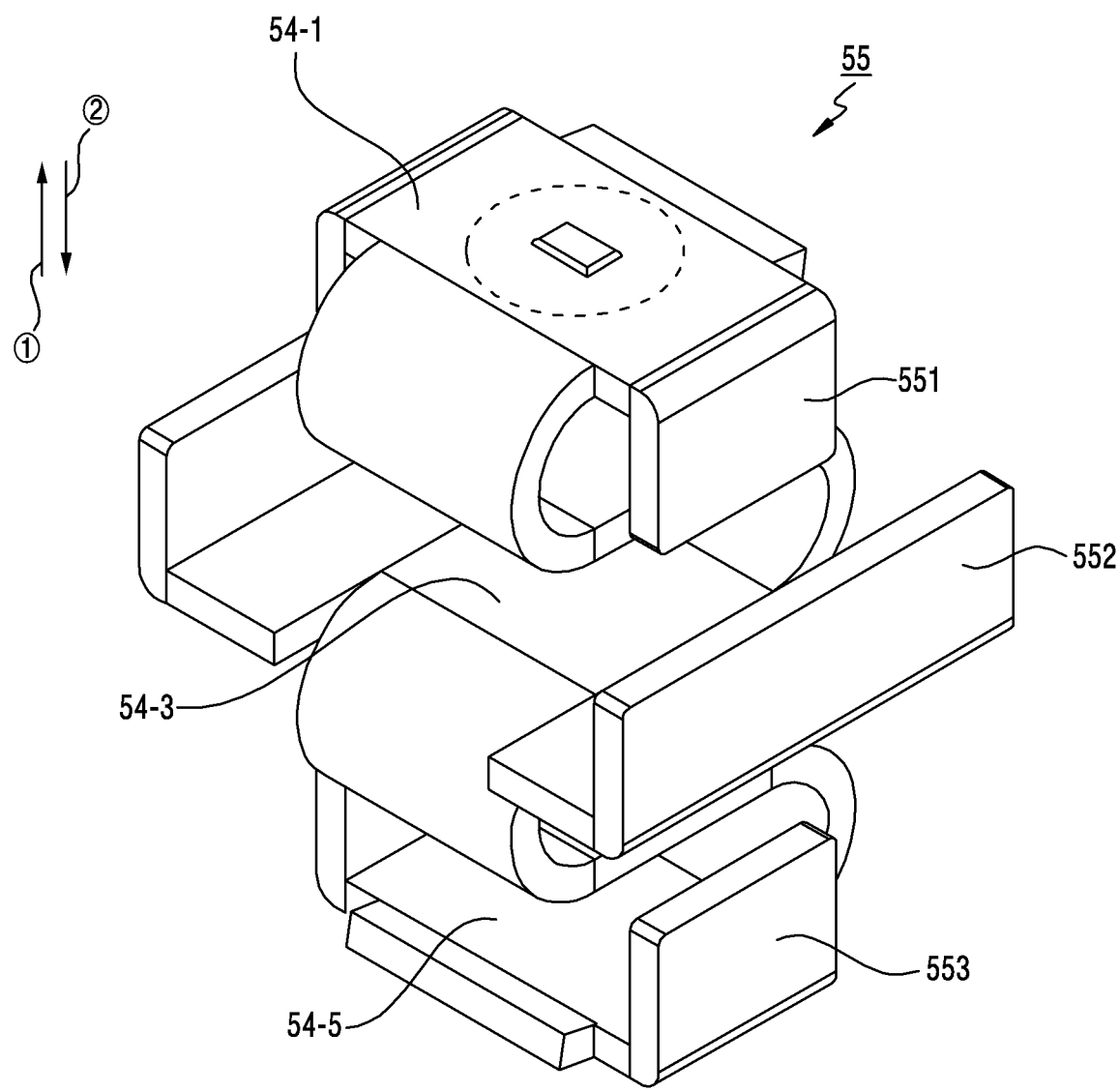
FIG. 12A is a perspective view illustrating a double alphabet S shaped dual contact member according to an embodiment of the disclosure.
Figure 12B:
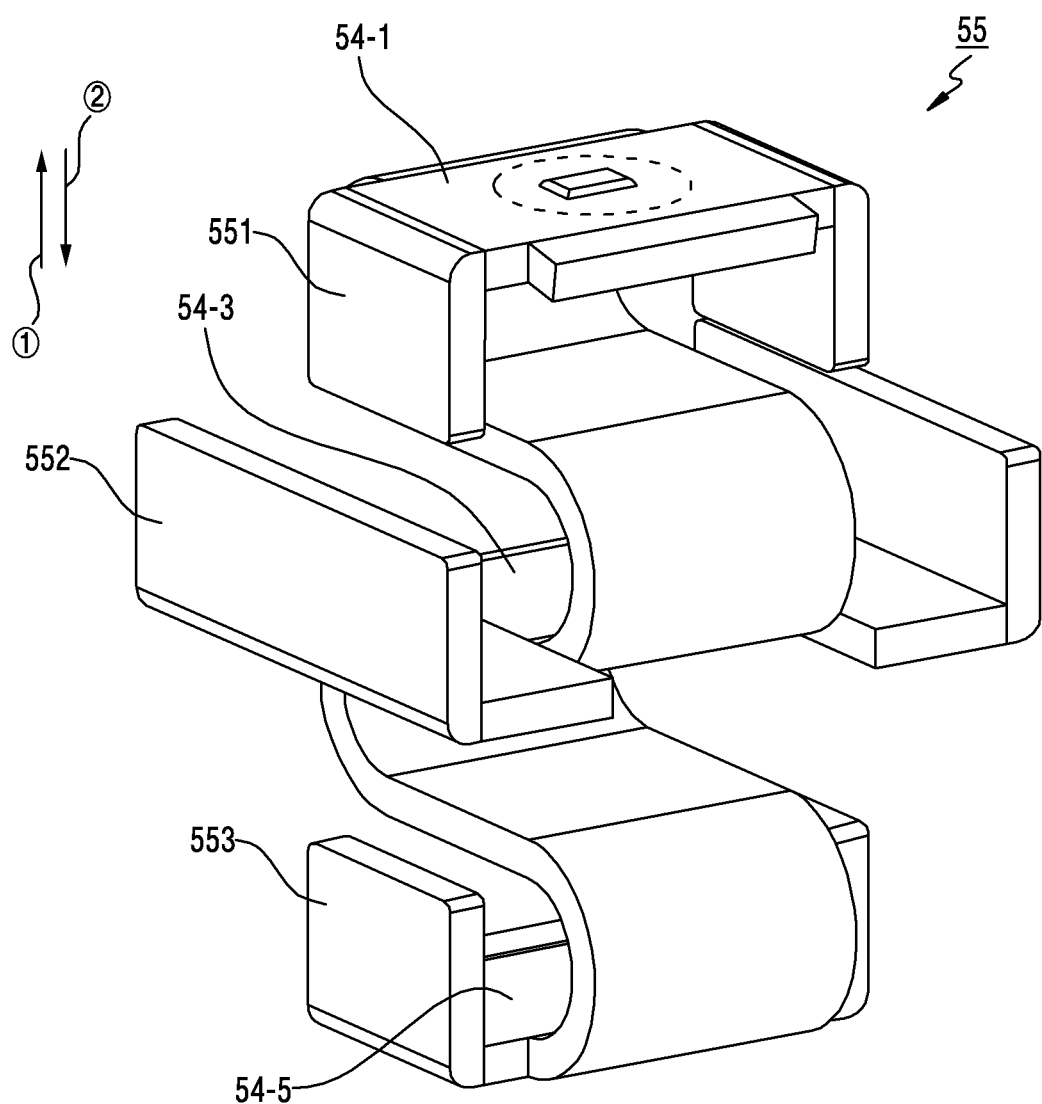
FIG. 12B is a perspective view illustrating a double alphabet S shaped dual contact member according to an embodiment of the disclosure.
Figure 12C:
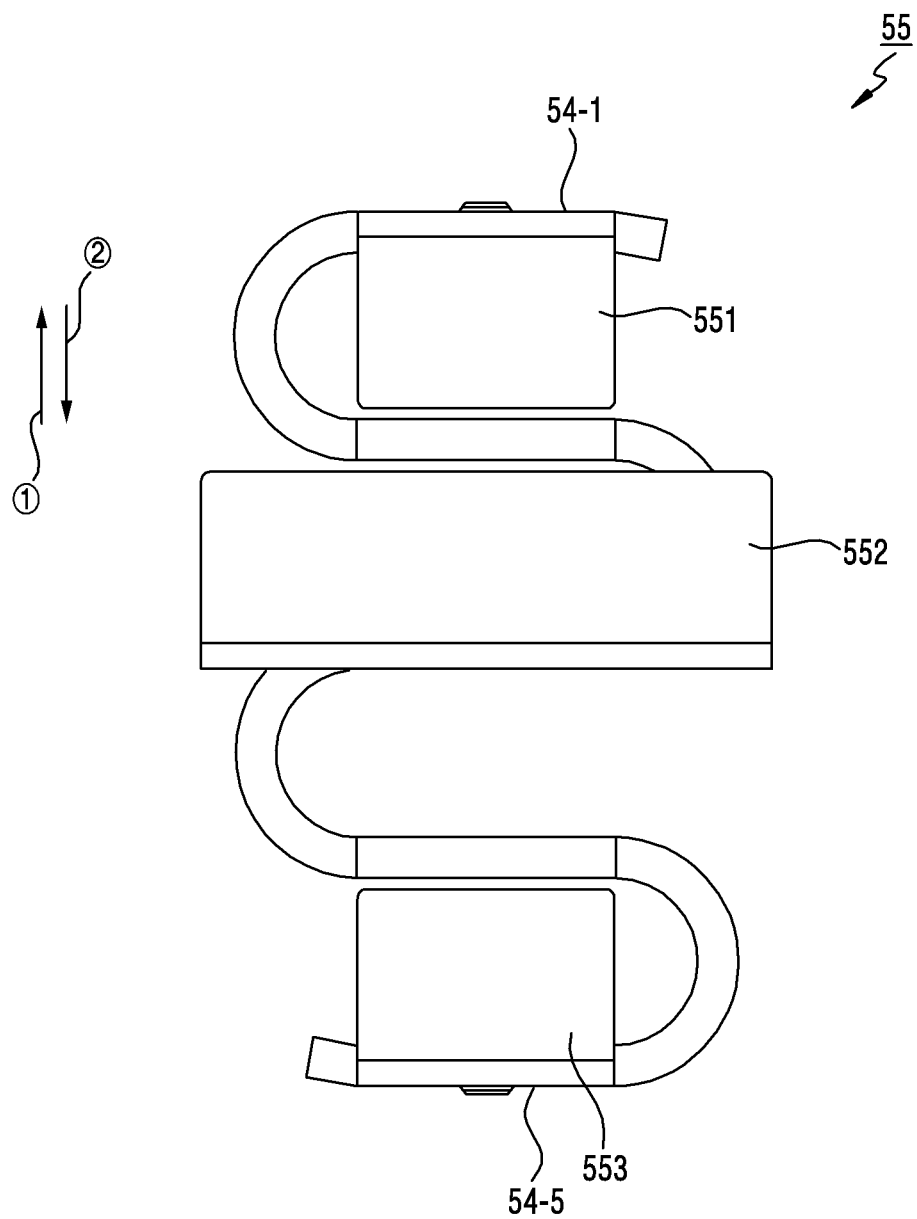
FIG. 12C is a side view illustrating a double alphabet S shaped dual contact member according to an embodiment of the disclosure.

FIG. 12A and FIG. 12B are perspective views each illustrating a double alphabet S shaped dual contact member according to an embodiment of the disclosure. FIG. 12C is a side view illustrating a double alphabet S shaped dual contact member according to an embodiment of the disclosure.

Referring to FIG. 12A, FIG. 23B, and FIG. 12C, a flexible conductive member 55 according to an embodiment will be described only in terms of its differences from the flexible conductive member 54 of FIG. 11A, FIG. 11B, and FIG. 11C, and descriptions of their similarities will be omitted to avoided redundancy. Since an alphabet SS shaped elastic conductive portion of the flexible conductive member 55 is constructed in the same manner as the alphabet SS shaped elastic conductive portion 543 of the flexible conductive member 54 of FIG. 11A, FIG. 11B, and FIG. 11C, detailed descriptions of the SS shaped elastic conductive portion 543 will be omitted.

A base according to an embodiment may include a first base 551 constructed in the first portion 54-1 to face the second direction, a second base 552 constructed in the third portion 54-3 to face the first direction, and a third base 553 constructed in the fifth portion 54-5 to face the first direction. Each of the first to third bases 551 to 553 may be constructed in pairs. The first base 551 may be constructed by bending two ends of the first portion 54-1 in the second direction. The second base 552 may be constructed by bending two ends of the third portion 54-3 in the first direction. The third base 553 may be constructed by bending two ends of the fifth portion 54-5 in the first direction. The first portion 54-1 may have an suction region disposed on a first face facing the first direction. The suction region may adhere the first portion 54-1 to a substrate of a Surface Mount device (SMD).

Figure 13A:
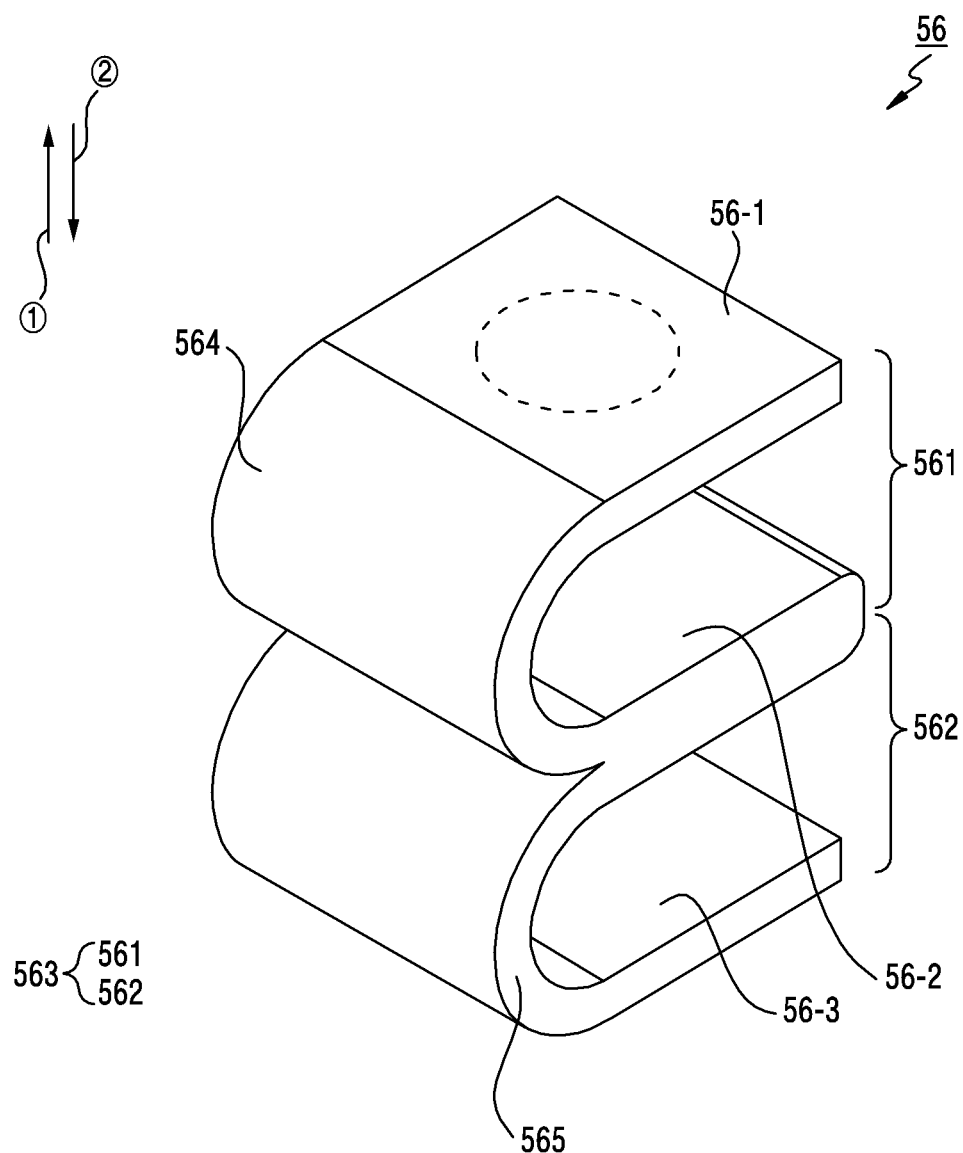
FIG. 13A is a perspective view illustrating an alphabet E shaped dual contact member according to an embodiment of the disclosure.
Figure 13B:
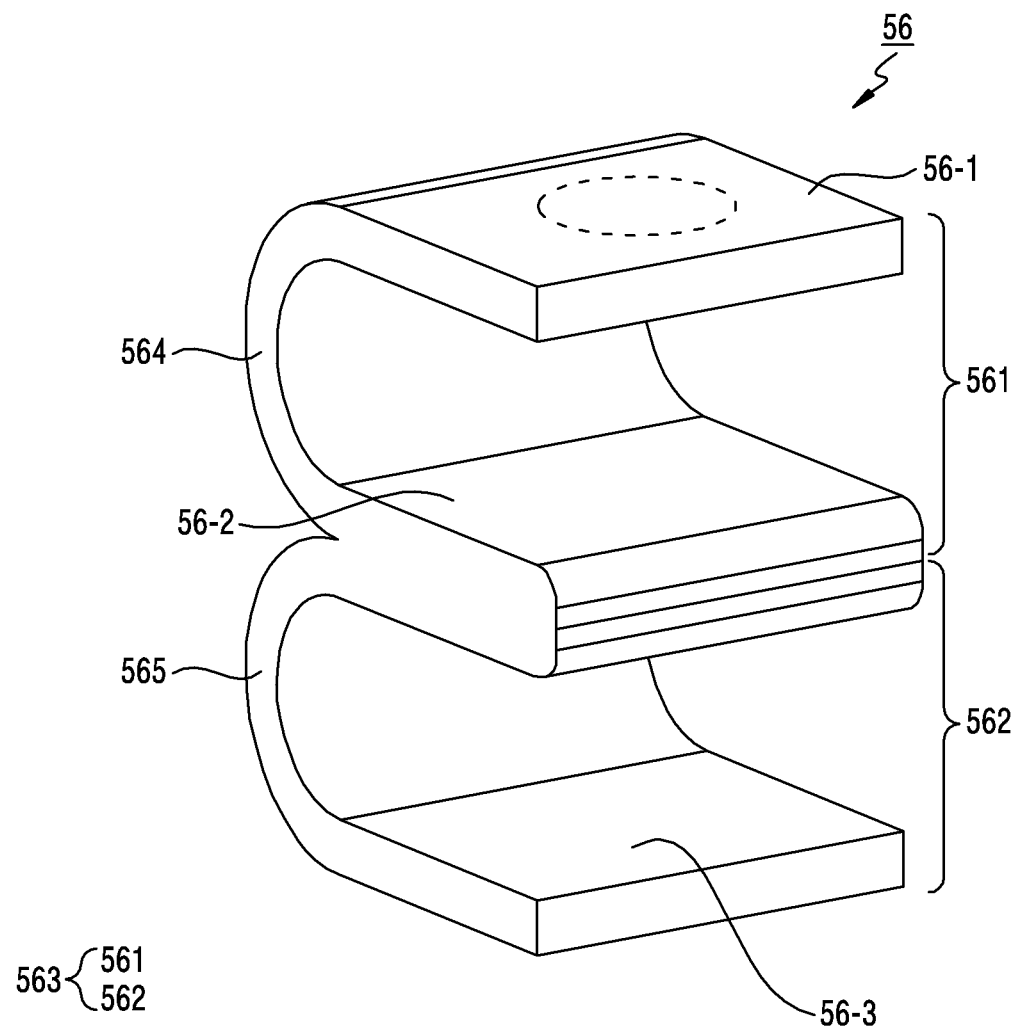
FIG. 13B is a perspective view illustrating an alphabet E shaped dual contact member according to an embodiment of the disclosure.
Figure 13C:
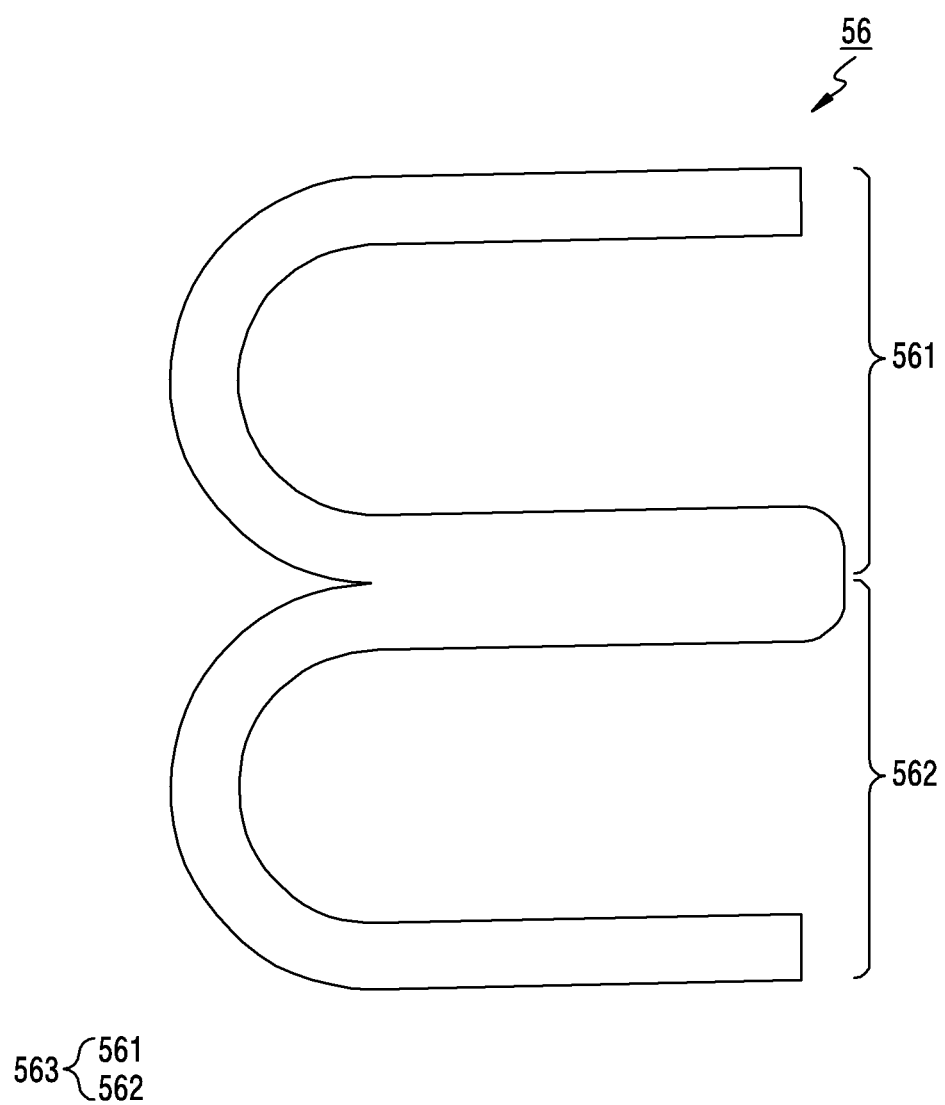
FIG. 13C is a side view illustrating an alphabet E shaped dual contact member according to an embodiment of the disclosure.

FIG. 13A and FIG. 13B are perspective views each illustrating an alphabet E shaped dual contact member according to an embodiment of the disclosure. FIG. 13C is a side view illustrating an alphabet E shaped dual contact member according to an embodiment of the disclosure.

Referring to FIG. 13A, FIG. 13B, and FIG. 13C, a flexible conductive member 56 according to an embodiment (corresponding to the flexible conductive member 40 of FIG. 4) may include an elastic conductive portion 563 that includes at least one bent portions 56-1 to 56-3. The elastic conductive portion 563 may have an alphabet E shape, and may include a first flexible option 561 facing a first direction with respect to a PCB and a second flexible portion 562 facing a second direction. For example, the first flexible portion 561 may have an alphabet C shape, and the second flexible portion 562 may have the alphabet C shape.

The elastic conductive portion 563 according to an embodiment may include the first flexible portion 561 and the second flexible portion 562 that are connected integrally. The first flexible portion 561 may include the first portion 56-1 and the second portion 56-2 bent in the second direction from the first portion 56-1. In addition, the first flexible portion 561 may have a first bending portion 564 located between the first and second portions 56-1 and 56-2. The second flexible portion 562 may include the third portion 56-3 bent in the second direction from the second portion 56-2. In addition, the second flexible portion 562 may have a second bending portion 565 located between the second and third portions 56-2 and 56-3. The second portion 56-2 may be the portion that connects the first and second flexible portions 561 and 562.

The elastic conductive portion 563 according to an embodiment may maintain a state where each of the first and third portions 56-1 and 56-3 are in contact with the first and second conductive structures due to elastic force provided by first and second bending portions 564 to 565 of two places. Substantially, the first to third portions 56-1 and 56-3 may be in a state of being parallel to each other, and may maintain the parallel state.

Figure 14A:
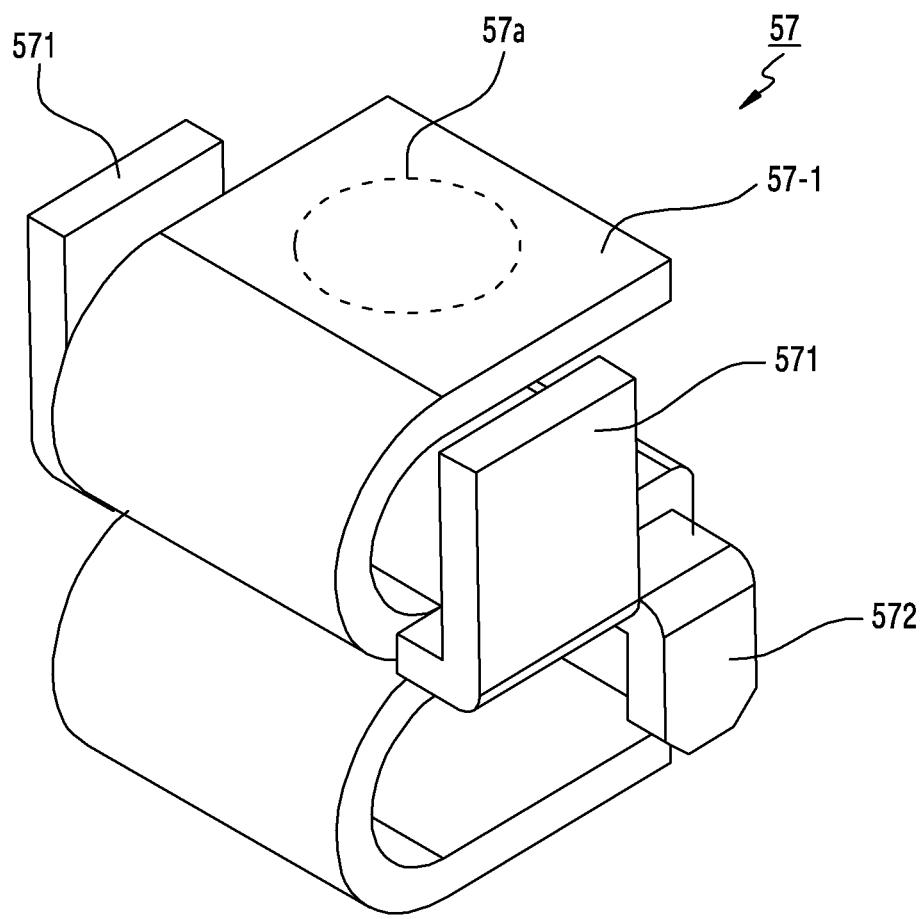
FIG. 14A is a perspective view illustrating an alphabet E shaped dual contact member according to an embodiment of the disclosure.
Figure 14B:
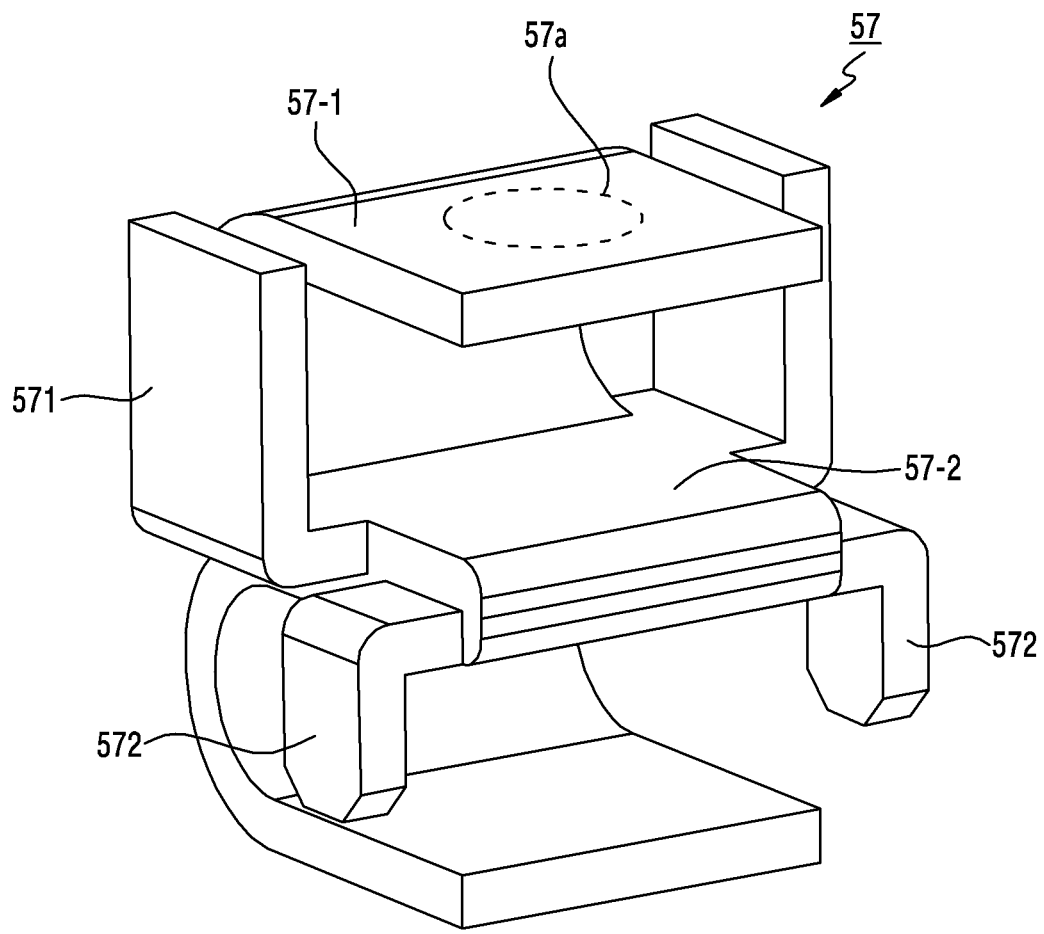
FIG. 14B is a perspective view illustrating an alphabet E shaped dual contact member according to an embodiment of the disclosure.
Figure 14C:
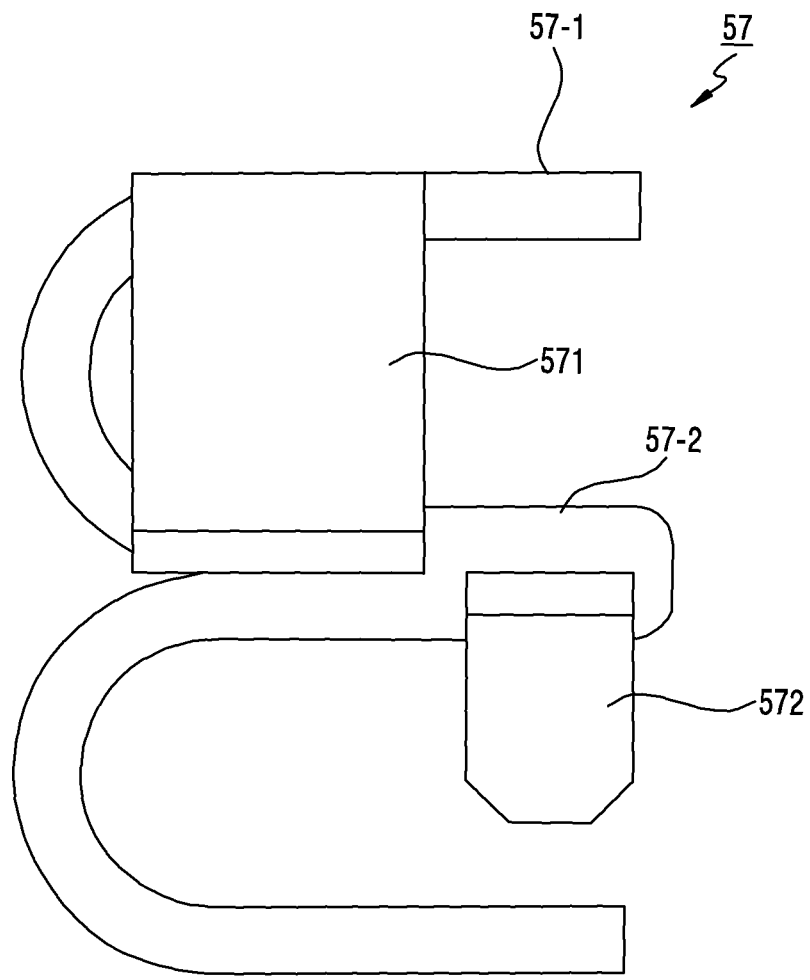
FIG. 14C is a side view illustrating an alphabet E shaped dual contact member according to an embodiment of the disclosure.

FIG. 14A and FIG. 14B are perspective views each illustrating an alphabet E shaped dual contact member according to an embodiment of the disclosure. FIG. 14C is a side view illustrating an alphabet E shaped dual contact member according to various embodiments of the disclosure.

Referring to FIG. 14A, FIG. 14B, and FIG. 14C, a flexible conductive member 57 according to an embodiment will be described only in terms of its differences from the flexible conductive member 56 of FIG. 13A, FIG. 13B, and FIG. 13C, and descriptions of their similarities will be omitted to avoided redundancy. Since an alphabet E shaped elastic conductive portion of the flexible conductive member 57 is constructed in the same manner as the alphabet E shaped elastic conductive portion 563 of the flexible conductive member 56 of FIG. 13A, FIG. 13B, and FIG. 13C, detailed descriptions of the E shaped elastic conductive portion will be omitted.

A base according to an embodiment may include a first base 571 constructed in a second portion 57-2 to face a first direction and a contact pin 572 constructed in a second portion 57-2 to face a second direction. Each of the first base 571 and the contact pin 572 may be constructed in pairs.

The first base 571 may be constructed by bending two ends of the second portion 57-2 in the first direction. The first and second contact pins may be constructed by bending two ends of the second portion 57-2 in the second direction. For example, the first base 571 and the first and second contact pins may be bent at about 90 degrees. The first portion 57-1 may have an suction region 57a disposed on a first face facing the first direction. The suction region 57a may be used to adhere the first portion 57-1 to a substrate of an SMD.

Figure 15A:
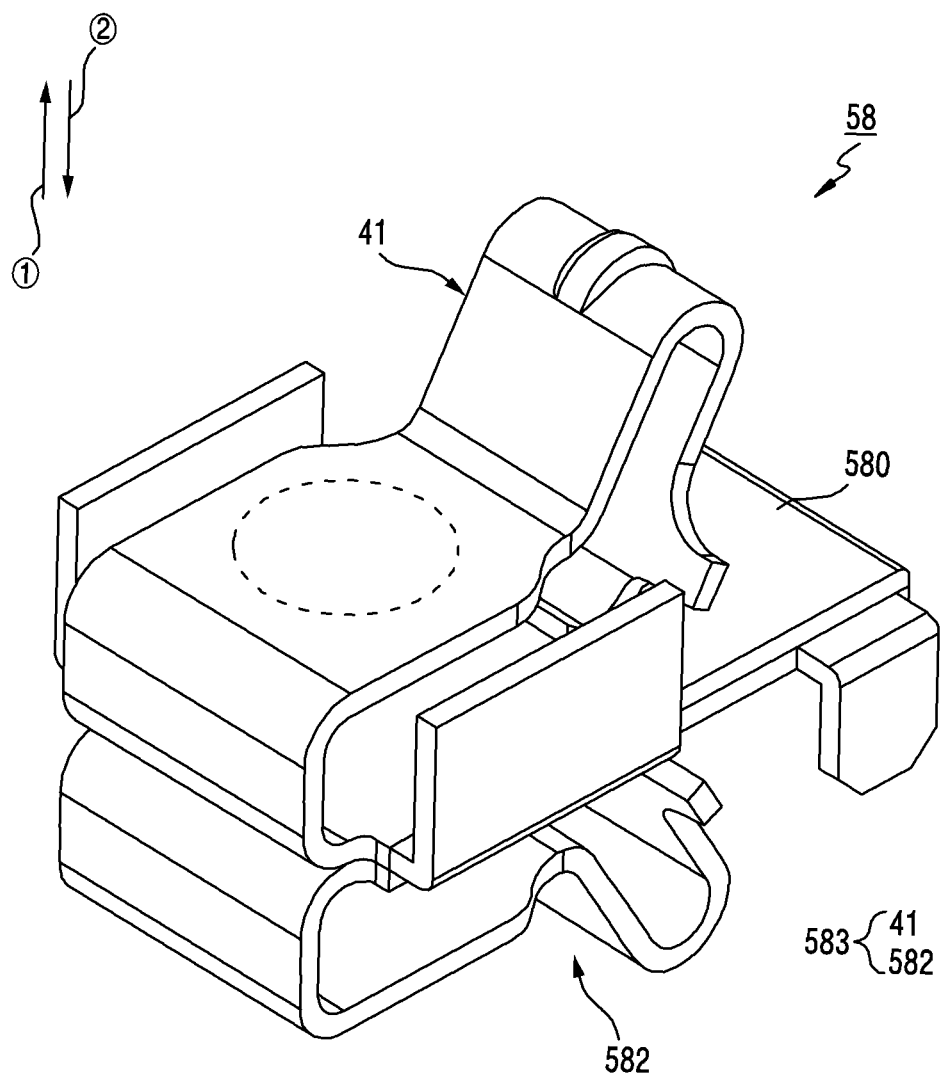
FIG. 15A is a perspective view illustrating a dual contact member according to an embodiment of the disclosure.
Figure 15B:
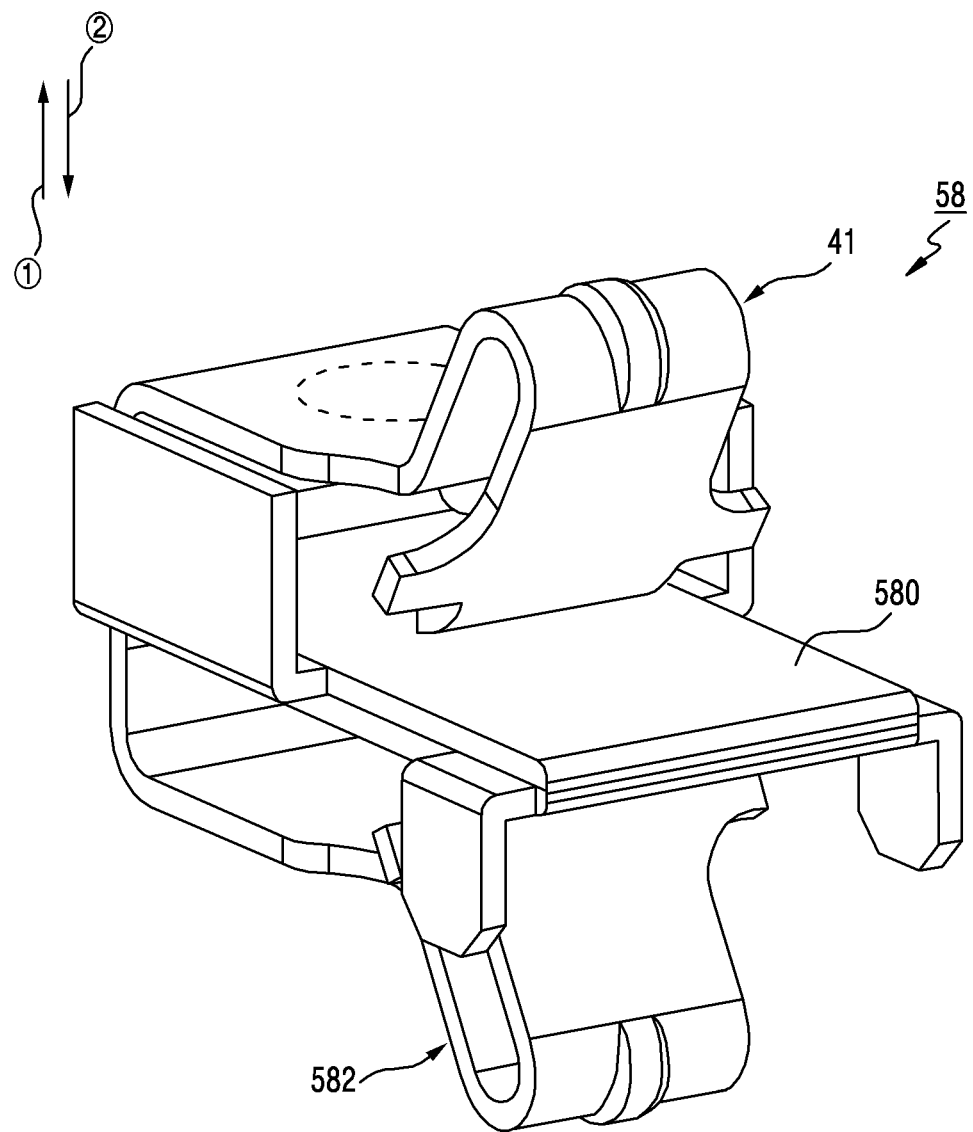
FIG. 15B is a perspective view illustrating a dual contact member according to an embodiment of the disclosure.
Figure 15C:
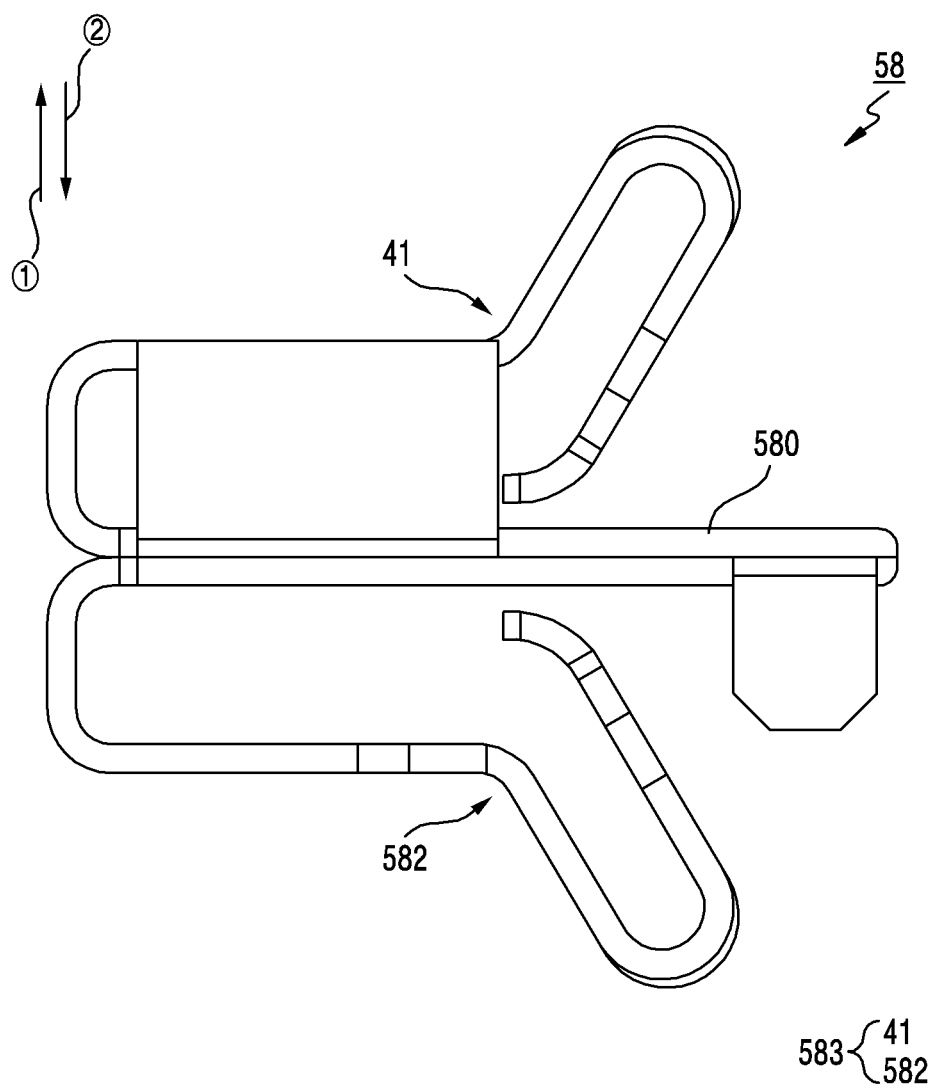
FIG. 15C is one side view illustrating a dual contact member according to an embodiment of the disclosure.

FIG. 15A and FIG. 15B are perspective views each illustrating a dual contact member according to an embodiment of the disclosure. FIG. 15C is one side view illustrating a dual contact member according to an embodiment of the disclosure.

Referring to FIG. 15A, FIG. 15B, and FIG. 15C, a flexible conductive member 58 according to an embodiment will be described only in terms of its differences from the flexible conductive member 40 of FIG. 5A, FIG. 5B, and FIG. 5C, and descriptions of their similarities will be omitted to avoided redundancy. In the flexible conductive member 58, the first flexible portion 41 may have the same structure as that in the flexible conductive member 40, and a second flexible portion 582 may have a different structure compared to the flexible conductive member 40 of FIG. 5A, FIG. 5B, and FIG. 5C.

The flexible conductive member 58 according to an embodiment may have an elastic conductive portion 583. The second flexible portion 582 of the flexible conductive member 58 according to an embodiment may be vertically symmetric to the first flexible portion 41 about the base 580. For example, the first flexible portion 41 may be disposed in a first direction by being bent from the base 580 and be in an inclined direction. The second flexible portion 582 may be disposed in a second direction by being bent from the base 580 and be in a similar inclined direction that is mirrored from the inclined direction of the first flexible portion 41.

Figure 16:
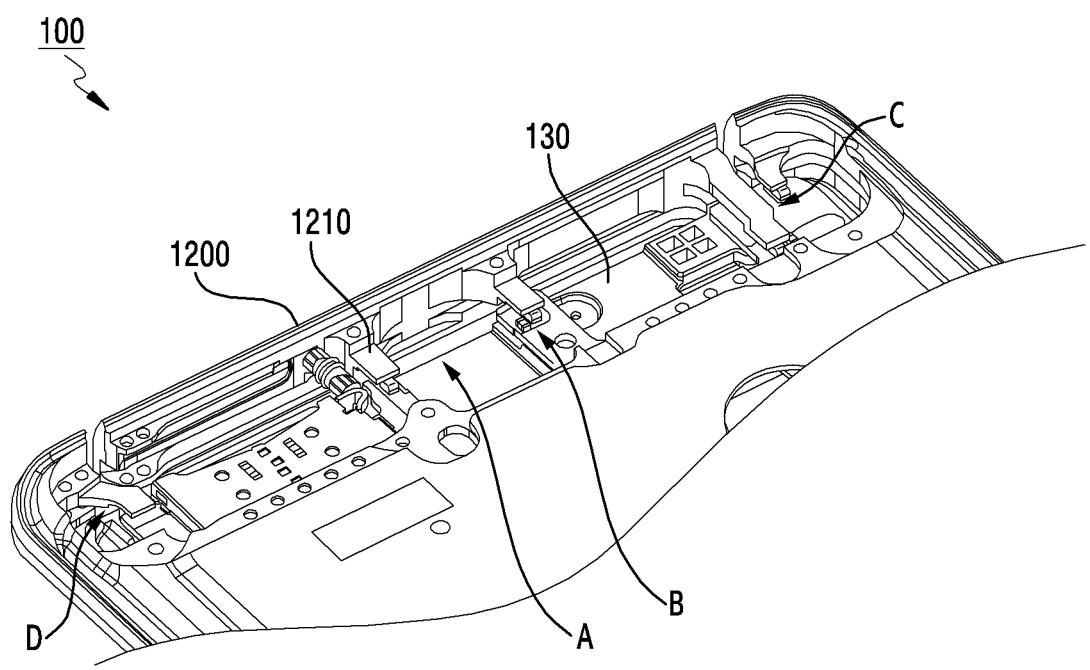
FIG. 16 is a perspective view illustrating part of an electronic device to show a location at which a dual contact member is mounted according to an embodiment of the disclosure.

Referring to FIG. 16, the electronic device 100 according to an embodiment (e.g., the electronic device 100 of FIG. 1, the electronic device 100 of FIG. 4, or the electronic device 100 of FIG. 7A) may have any one of flexible conductive members illustrated in FIG. 5A, FIG. 5B, FIG. 5C, FIG. 6A, FIG. 6B, and FIG. 6C and FIG. 8A, FIG. 8B, FIG. 8C, FIG. 9A, FIG. 9B, FIG. 9C, FIG. 10A, FIG. 10B, FIG. 10C. FIG. 11A, FIG. 11B, FIG. 11C, FIG. 12A, FIG. 12B, FIG. 12C, FIG. 13A, FIG. 13B, FIG. 13C, FIG. 14A, FIG. 14B, FIG. 14C, FIG. 15A, FIG. 15B, and FIG. 15C installed in first to fourth regions A to D. For example, the selected flexible conductive member may be mounted in one region, or two or more regions, selected from the first to fourth regions A to D.

For example, if the flexible conductive member is mounted in the second region B, the flexible conductive member may electrically connect a conductive protrusion 1210 of a first conductive structure 1200 of a metal housing, which is operating as a radiator, to the conductive pattern 131 of an LDS antenna (e.g., the second conductive structure 130 of FIG. 4), and may maintain the contact state.

According to an embodiment of the disclosure, an electronic device (e.g., the electronic device 100 of FIG. 1) may include a housing (e.g., the housing 110 of FIG. 1) including a first plate (e.g., the front plate 102 of FIG. 1), a second plate (e.g., the rear plate 111 of FIG. 2) facing away from the first plate, and a side member (e.g., the side member 118 of FIG. 1) surrounding a space between the first and second plates, a printed circuit board (e.g., the PCB 340 of FIG. 4) disposed in the space, parallel to the first plate, and including an opening, a first conductive structure (e.g., the first conductive structure 1200 of FIG. 4) disposed in the space and at least partially located between the printed circuit board and the first plate, a second conductive structure (e.g., the second conductive structure 130 of FIG. 4) disposed in the space and at least partially located between the printed circuit board and the second plate, and a flexible conductive member (e.g., the flexible conductive member 40 of FIG. 5A, FIG. 5B, and FIG. 5C) located between the first and second conductive structures through the opening to construct an electrical path between the first and second conductive structures. The flexible conductive member may include a base (e.g., the base 400 of FIG. 5A, FIG. 5B, and FIG. 5C) fixed to the printed circuit board, a first flexible portion (e.g., the first flexible portion 41 of FIG. 5A, FIG. 5B, and FIG. 5C) having a first height (e.g., the first height h1 of FIG. 6C) from the base, protruding from the base toward the first plate, and in contact with the first conductive structure, and a second flexible portion (e.g., the second conductive portion 42 of FIG. 5A, FIG. 5B, and FIG. 5C) having a second height (e.g., the second height h2 of FIG. 6C) from the base, protruding from the base toward the second plate, and in contact with the second conductive structure.

According to an embodiment of the disclosure, the printed circuit board (e.g., the PCB 340 of FIG. 4) may include a first face (e.g., the first face 340a of FIG. 4) facing the first plate and a second face (e.g., the second face 340b of FIG. 4) facing the second plate, wherein the base is mounted to the first face.

According to an embodiment of the disclosure, the flexible conductive member (e.g., the flexible conductive member 40 of FIG. 5A, FIG. 5B, and FIG. 5C) may include a first stopper structure (e.g., the first stopper structure 402 of FIG. 6A to FIG. 6C) having a third height (e.g., the third height h3 of FIG. 6C) less than the first height from the base and protruding from the base toward the first plate, and a second stopper structure (e.g., the second stopper structure 404 of FIG. 6A, FIG. 6B, and FIG. 6C) having a fourth height (e.g., the fourth height h4 of FIG. 6C) less than the second height from the base and protruding from the base toward the second plate.

According to an embodiment of the disclosure, the fourth height (e.g., the fourth height h4 of FIG. 6C) may be less than a thickness of the printed circuit board.

According to an embodiment of the disclosure, the third height (e.g., the third height h3 of FIG. 6C) may be greater than the fourth height (e.g., the fourth height h4 of FIG. 6C).

According to an embodiment of the disclosure, at least a portion of the first conductive structure (e.g., the first conductive structure 1200 of FIG. 4) is a portion of the side member (e.g., the side member 118 of FIG. 1).

According to an embodiment of the disclosure, the second conductive structure (e.g., the second conductive structure 130 of FIG. 4) may include a non-conductive structure (e.g., the non-conductive structure 130a of FIG. 4) and a conductive pattern (e.g., the conductive pattern 131 of FIG. 4).

According to an embodiment of the disclosure, the electronic device may further include a radio frequency circuitry (e.g., the RF circuitry 341 of FIG. 4) mounted to the first face of the printed circuit board and electrically connected to the flexible conductive member.

According to an embodiment of the disclosure, the first flexible portion (e.g., the first flexible portion 41 of FIG. 5A, FIG. 5B, and FIG. 5C) may further include a first hook portion (e.g., the first hook portion 415 of FIG. 5A, FIG. 5B, and FIG. 5C) whose movement is restricted by the first stopper structure, and the second flexible portion (e.g., the second flexible portion 42 of FIG. 5A, FIG. 5B, and FIG. 5C) may further include a second hook portion (e.g., the second hook portion 425 of FIG. 5A, FIG. 5B, and FIG. 5C) whose movement is restricted by the second stopper structure.

According to an embodiment of the disclosure, the electronic device may further include at least one first contact pin (e.g., the first contact pin 403 of FIG. 6A, FIG. 6B, and FIG. 6C) protruding in the second direction by being bent from the base, and at least one second contact pin (e.g., the second contact pin 405 of FIG. 6A, FIG. 6B, and FIG. 6C), separate from the at least one first contact pin, and protruding in the second direction by being bent from the base.

According to an embodiment of the disclosure, the first flexible portion or the second flexible portion may have an suction region (e.g., the suction region 416 of FIG. 5A, FIG. 5B, and FIG. 5C) in a portion parallel to the base and is mounted to the printed circuit board.

According to an embodiment of the disclosure, the base (e.g., the base 400 of FIG. 5A, FIG. 5B, and FIG. 5C) may include a first peripheral portion (e.g., the first peripheral portion 400a of FIG. 5A, FIG. 5B, and FIG. 5C) and a second peripheral portion (e.g., the second peripheral portion 400b of FIG. 5A, FIG. 5B, and FIG. 5C) parallel to the first peripheral portion. The first flexible portion may include a first portion (e.g., the first portion 41-1 of FIG. 5A, FIG. 5B, and FIG. 5C) protruding from the first peripheral portion toward the first plate, a second portion (e.g., the second portion 41-2 of FIG. 5A, FIG. 5B, and FIG. 5C) bent from the first portion toward the second peripheral portion, a third portion (e.g., the third portion 41-3 of FIG. 5A, FIG. 5B, and FIG. 5C) bent from the second portion toward the first plate, and a fourth portion (e.g., the fourth portion 41-4 of FIG. 5A, FIG. 5B, and FIG. 5C) bent from the third portion toward the first peripheral portion. The second flexible portion may include a fifth portion (e.g., the fifth portion 42-1 of FIG. 5A, FIG. 5B, and FIG. 5C) protruding from the second peripheral portion toward the second plate, a sixth portion (e.g., the sixth portion 42-2 of FIG. 5A, FIG. 5B, and FIG. 5C) bent from the fifth portion toward the first peripheral portion, a seventh portion (e.g., the seventh portion 42-3 of FIG. 5A, FIG. 5B, and FIG. 5C) bent from the sixth portion toward the second plate, and an eighth portion (e.g., the eighth portion 42-4 of FIG. 5A, FIG. 5B, and FIG. 5C) bent from the seventh portion toward the second peripheral portion.

According to an embodiment of the disclosure, the second portion (e.g., the second portion 41-2 of FIG. 5A, FIG. 5B, and FIG. 5C) or the sixth portion (e.g., the sixth portion 42-2 of FIG. 5A, FIG. 5B, and FIG. 5C) may have an suction region in a portion parallel to the base and is mounted to the printed circuit board.

According to an embodiment of the disclosure, a dual contact member (e.g., the flexible conductive member 40 of FIG. 5A, FIG. 5B, and FIG. 5C) may include a base, a first flexible portion (e.g., the first flexible portion 41 of FIG. 5A, FIG. 5B, and FIG. 5C) bent from one side of the base to be disposed in a first direction, a second flexible portion (e.g., the second flexible portion 42 of FIG. 5A, FIG. 5B, and FIG. 5C) bent from another side of the base to be disposed in a second direction opposite to the first direction, and an suction region (e.g., the suction region 416 of FIG. 5A, FIG. 5B, and FIG. 5C) disposed in a portion of the first flexible portion or second flexible portion parallel to the base so as to be mounted to a printed circuit board.

According to an embodiment of the disclosure, the dual contact member may further include a first stopper structure (e.g., the first stopper structure 402 of FIG. 6A, FIG. 6B, and FIG. 6C) bent from the base to be protruding in the first direction, and a second stopper structure (e.g., the second stopper structure 404 of FIG. 6A, FIG. 6B, and FIG. 6C) bent from the base to be protruding in the second direction.

According to an embodiment of the disclosure, the first flexible portion may further include a first hook portion (e.g., the first hook portion 415 of FIG. 5A, FIG. 5B, FIG. 5C, FIG. 6A, FIG. 6B, and FIG. 6C) whose movement is restricted by the first stopper structure, and the second flexible portion may further include a second hook portion (e.g., the second hook portion 425 of FIG. 5A, FIG. 5B, FIG. 5C, FIG. 6A, FIG. 6B, and FIG. 6C) whose movement is restricted by the second stopper structure.

According to an embodiment of the disclosure, the dual contact member may further include at least one first contact pin (e.g., the first contact pin 403 of FIG. 6A, FIG. 6B, and FIG. 6C) bent from the base to be protruding in the second direction, and at least one second contact pin (e.g., the second contact pin 405 of FIG. 6A, FIG. 6B, and FIG. 6C), separate from the at least one first contact pint, bent from the base to be protruding in the second direction.

According to an embodiment of the disclosure, the base may include a first peripheral portion and a second peripheral portion parallel to the first peripheral portion. The first flexible portion may include a first portion bent from the first peripheral portion to face the first direction, a second portion bent from the first portion to face a direction parallel to the base, a third portion bent from the second portion to face an inclined direction, and a fourth portion bent from the third portion. The second flexible portion may include a fifth portion bent from the second peripheral portion to face the second direction, a sixth portion bent from the fifth portion to face the direction parallel to the base, a seventh portion bent from the sixth portion to face the inclined direction, and an eighth portion bent from the seventh portion to face a direction parallel to the seventh portion.

According to an embodiment of the disclosure, a bending portion (e.g., the bending portion 413 of FIG. 5A, FIG. 5B, and FIG. 5C) between the third and fourth portions may include a first contact point (e.g., the first contact protrusion 413a of FIG. 5A, FIG. 5B, and FIG. 5C), and a bending portion (e.g., the bending portion 423 of FIG. 5A, FIG. 5B, and FIG. 5C) between the seventh and eighth portions may include a second contact point (e.g., the second contact protrusion 423a of FIG. 5A, FIG. 5B, and FIG. 5C).

According to an embodiment of the disclosure, an suction region may be disposed in the second portion (e.g., the second portion 41-2 of FIG. 5A, FIG. 5B, and FIG. 5C) or the sixth portion (e.g., the sixth portion 42-2 of FIG. 5A, FIG. 5B, and FIG. 5C).

According to an embodiment of the disclosure, a first hook portion (e.g., the first hook portion 415 of FIG. 5A, FIG. 5B, and FIG. 5C) may be disposed to a free end of the fourth portion (e.g., the fourth portion 41-4 of FIG. 5A, FIG. 5B, and FIG. 5C), and a second hook portion (e.g., the second hook portion 425 of FIG. 5A, FIG. 5B, and FIG. 5C) may be disposed to a free end of the eight portion (e.g., the eighth portion 42-2 of FIG. 5A, FIG. 5B, and FIG. 5C).

Certain embodiments of the disclosure may provide a dual contact member for ensuring a vertical gap between the display panel and the antenna of an electronic device, where the antenna is part of the metal housing of the electronic device. The electronic device including the dual contact member is also provided.

Certain embodiments of the disclosure may provide a dual contact member capable of ensuring a vertical gap between the display panel and the antenna of an electronic device, where the antenna is part of the metal housing of the electronic device, and the dual contact member may be integrally constructed from a base. The electronic device including the dual contact member is also provided.

Accordingly, certain embodiments of the disclosure may provide an electronic device of which thickness is decreased due to a slim dual contact structure.

Certain embodiments of the disclosure disclosed in the instant specification and the drawing are merely specific examples presented for illustration and are not intended to limit the scope of the disclosure. Therefore, in addition to the embodiments disclosed herein, various changes may be made without departing from the technical concept of the disclosure, and will be construed as being within the scope of the disclosure.

What is claimed is:

1. An electronic device comprising:
    a housing including a first plate, a second plate facing away from the first plate, and a conductive side member surrounding a space between the first and second plates;
    a printed circuit board disposed in the space, parallel to the first plate, and including an opening;
    a first conductive structure disposed in the space and at least partially located between the printed circuit board and the first plate;
    a second conductive structure disposed in the space and at least partially located between the printed circuit board and the second plate; and
    a flexible conductive member located between the first and second conductive structures through the opening to construct an electrical path between the first and second conductive structures,
    wherein the flexible conductive member includes:
        a base fixed to the printed circuit board;
        a first flexible portion having a first height from the base, protruding from the base toward the first plate, and in contact with the first conductive structure; and
        a second flexible portion having a second height from the base, protruding from the base toward the second plate, and in contact with the second conductive structure,
    wherein the base further comprises a first peripheral portion and a second peripheral portion parallel to the first peripheral portion,
    wherein the first flexible portion further comprises:
        a first portion protruding from the first peripheral portion toward the first plate;
        a second portion bent from the first portion toward the second peripheral portion;
        a third portion bent from the second portion toward the first plate; and
        a fourth portion bent from the third portion toward the first peripheral portion, and
    wherein the second flexible portion further comprises:
        a fifth portion protruding from the second peripheral portion toward the second plate;
        a sixth portion bent from the fifth portion toward the first peripheral portion;
        a seventh portion bent from the sixth portion toward the second plate; and
        an eighth portion bent from the seventh portion toward the second peripheral portion.

2. The electronic device of claim 1, wherein the printed circuit board further comprises a first face facing the first plate and a second face facing the second plate, wherein the base is mounted to the first face.

3. The electronic device of claim 2, wherein the flexible conductive member further comprises:
    a first stopper structure having a third height less than the first height from the base and protruding from the base toward the first plate; and
    a second stopper structure having a fourth height less than the second height from the base and protruding from the base toward the second plate.

4. The electronic device of claim 3, wherein the fourth height is less than a thickness of the printed circuit board.

5. The electronic device of claim 3, wherein the third height is greater than the fourth height.

6. The electronic device of claim 3, wherein the first flexible portion further comprises a first hook portion whose movement is restricted by the first stopper structure, and the second flexible portion further comprises a second hook portion whose movement is restricted by the second stopper structure.

7. The electronic device of claim 1, wherein at least a portion of the first conductive structure is a portion of the side member.

8. The electronic device of claim 1, wherein the second conductive structure further comprises a conductive pattern, and wherein the second flexible portion is in contact with the conductive pattern.

9. The electronic device of claim 2, further comprising a radio frequency circuitry mounted to the first face of the printed circuit board and electrically connected to the flexible conductive member.

10. The electronic device of claim 1, wherein the flexible conductive member further comprises:
    at least one first contact pin bent from the base and extending in a second direction; and
    at least one second contact pin, separate from the at least one first contact pin, bent from the base, and extending in the second direction.

11. The electronic device of claim 1, wherein the first flexible portion or the second flexible portion has an suction region in a portion parallel to the base.

12. The electronic device of claim 1, wherein the second portion or the sixth portion has an suction region in a portion parallel to the base and is mounted to the printed circuit board.

13. A dual contact member comprising:
    a base;
    a first flexible portion bent from one side of the base to be disposed in a first direction;
    a second flexible portion bent from another side of the base to be disposed in a second direction opposite to the first direction; and
    an suction region disposed in a portion of the first flexible portion or second flexible portion parallel to the base so as to be mounted to a printed circuit board,
    wherein the base further comprises a first peripheral portion and a second peripheral portion parallel to the first peripheral portion,
    wherein the first flexible portion further comprises:
        a first portion bent from the first peripheral portion to face the first direction;
        a second portion bent from the first portion to face a direction parallel to the base;
        a third portion bent from the second portion to face an inclined direction; and
        a fourth portion bent from the third portion, and
    wherein the second flexible portion further comprises:
        a fifth portion bent from the second peripheral portion to face the second direction;
        a sixth portion bent from the fifth portion to face the direction parallel to the base;
        a seventh portion bent from the sixth portion to face the inclined direction; and
        an eighth portion bent from the seventh portion to face a direction parallel to the seventh portion.

14. The dual contact member of claim 13, further comprising:
    a first stopper structure bent from the base to be protruding in the first direction; and
    a second stopper structure bent from the base to be protruding in the second direction.

15. The dual contact member of claim 14, wherein the first flexible portion further comprises a first hook portion whose movement is restricted by the first stopper structure, and the second flexible portion further comprises a second hook portion whose movement is restricted by the second stopper structure.

16. The dual contact member of claim 13, further comprising:
   at least one first contact pin bent from the base to be protruding in the second direction; and
   at least one second contact pin, separate from the at least one first contact point, bent from the base to be protruding in the second direction.

17. The dual contact member of claim 13, wherein an suction region is disposed in the second portion or the sixth portion.

18. The dual contact member of claim 13, wherein a first hook portion is disposed to a free end of the fourth portion, and a second hook portion is disposed to a free end of the eight portion.

\* \* \* \* \*

UNITED STATES PATENT AND TRADEMARK OFFICE
CERTIFICATE OF CORRECTION

PATENT NO. : 11,031,717 B2
APPLICATION NO. : 16/511331
DATED : June 8, 2021
INVENTOR(S) : Yonglak Cho et al.

Page 1 of 1

It is certified that error appears in the above-identified patent and that said Letters Patent is hereby corrected as shown below:

On the Title Page

Item (73), should read as follows:
Assignees: Samsung Electronics Co., Ltd.,
Suwon-si, Gyeonggi-do (KR);
Hyupjinconnector Co., Ltd.,
Ansan-si, Gyeonggi-do (KR)

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*